United States Patent [19]

Nose et al.

[11] Patent Number: 5,495,336

[45] Date of Patent: Feb. 27, 1996

[54] POSITION DETECTING METHOD FOR DETECTING A POSITIONAL RELATIONSHIP BETWEEN A FIRST OBJECT AND A SECOND OBJECT

[75] Inventors: Noriyuki Nose, Atsugi; Kunitaka Ozawa, Isehara; Masanobu Hasegawa, Fujisawa, all of Japan

[73] Assignee: Canon Kabushiki Kaisha, Tokyo, Japan

[21] Appl. No.: 441,982

[22] Filed: May 16, 1995

Related U.S. Application Data

[63] Continuation of Ser. No. 13,330, Feb. 4, 1993, abandoned.

[30] Foreign Application Priority Data

Feb. 4, 1992 [JP] Japan .................................. 4-047975
Feb. 14, 1992 [JP] Japan .................................. 4-059751

[51] Int. Cl.[6] .................................................. G01B 11/00
[52] U.S. Cl. .......................... 356/375; 356/401; 250/548
[58] Field of Search .................................. 356/399, 400, 356/401, 357, 375; 250/548

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,514,858 | 4/1985 | Novak | 378/34 |
| 5,028,797 | 7/1991 | Abe et al. | 250/548 |
| 5,114,235 | 5/1992 | Suda et al. | 356/401 |
| 5,142,156 | 8/1992 | Ozawa et al. | 250/548 |
| 5,148,037 | 9/1992 | Suda et al. | 250/548 |
| 5,160,848 | 11/1992 | Saitoh et al. | 250/548 |
| 5,162,656 | 11/1992 | Matsugu et al. | 250/548 |
| 5,200,800 | 4/1993 | Suda et al. | 356/401 |
| 5,225,892 | 7/1993 | Matsugu et al. | 356/401 |
| 5,235,408 | 8/1993 | Matsugu et al. | 356/401 |
| 5,313,272 | 5/1994 | Nose et al. | 356/401 |

FOREIGN PATENT DOCUMENTS

| | | |
|---|---|---|
| 61-111402 | 5/1986 | Japan . |
| 0001509 | 1/1990 | Japan .................................. 356/401 |
| 02-074808 | 3/1990 | Japan . |
| 560157033 | 12/1991 | Japan . |

Primary Examiner—Robert P. Limanek
Assistant Examiner—David B. Hardy
Attorney, Agent, or Firm—Fitzpatrick, Cella, Harper & Scinto

[57] ABSTRACT

A method of detecting the positional relationship between a first object and a second object is disclosed which includes projecting a first light through a convex lens mark of the first object and a concave lens pattern of the second object onto a first plane and projecting a second light through a concave lens mark of the first object and a convex lens pattern of the second object onto the first plane, wherein a first spacing between positions of incidence of the first light and the second light on the first plane increases with displacement of the second object relative to the first object in a predetermined direction. The method also includes projecting a third light through a concave lens mark of the first object and a convex lens pattern of the second object onto a second plane and projecting a fourth light through a convex lens mark of the first object and a concave lens pattern of the second object onto the second plane, wherein a second spacing between positions of incidence of the third light and the fourth light on the second plane decreases with displacement of the second object relative to the first object in the predetermined direction. The method also includes determining a reference for the detection of a position of the first object relative to a position of the second object on the basis of the first spacing and the second spacing as they become substantially equal to each other.

6 Claims, 17 Drawing Sheets

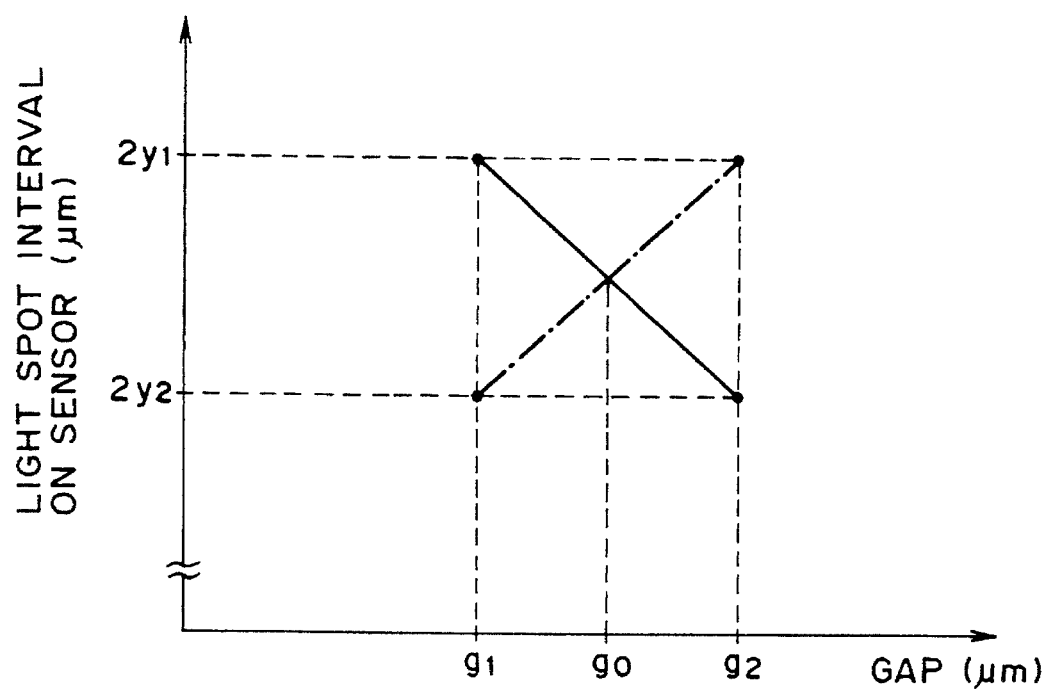
F I G. 12
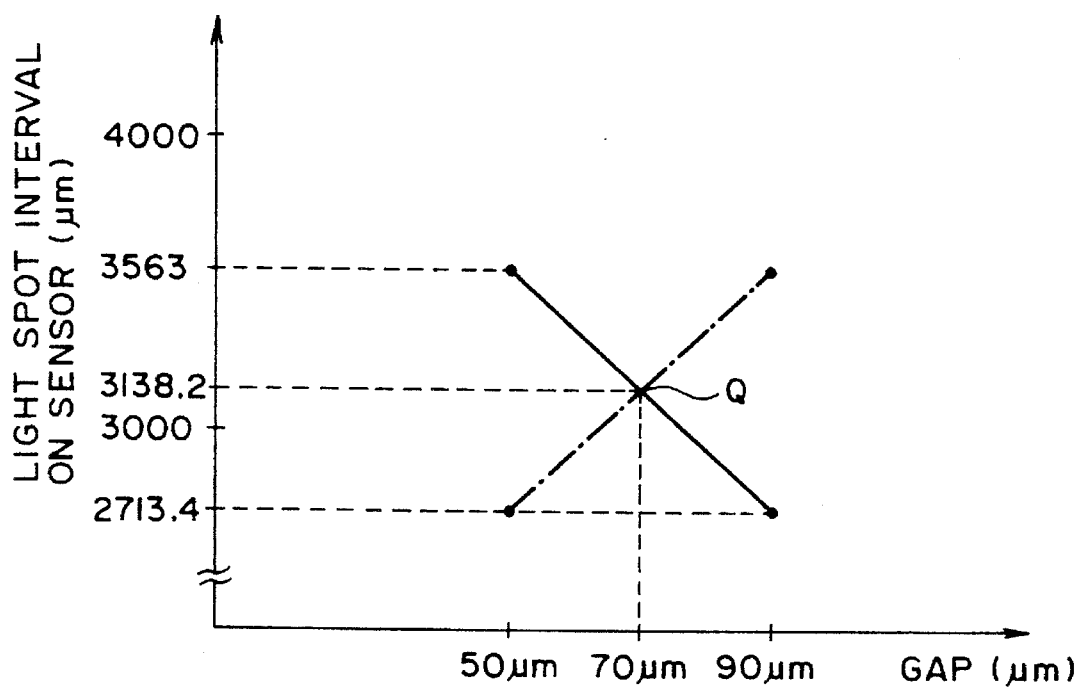
F I G. 13

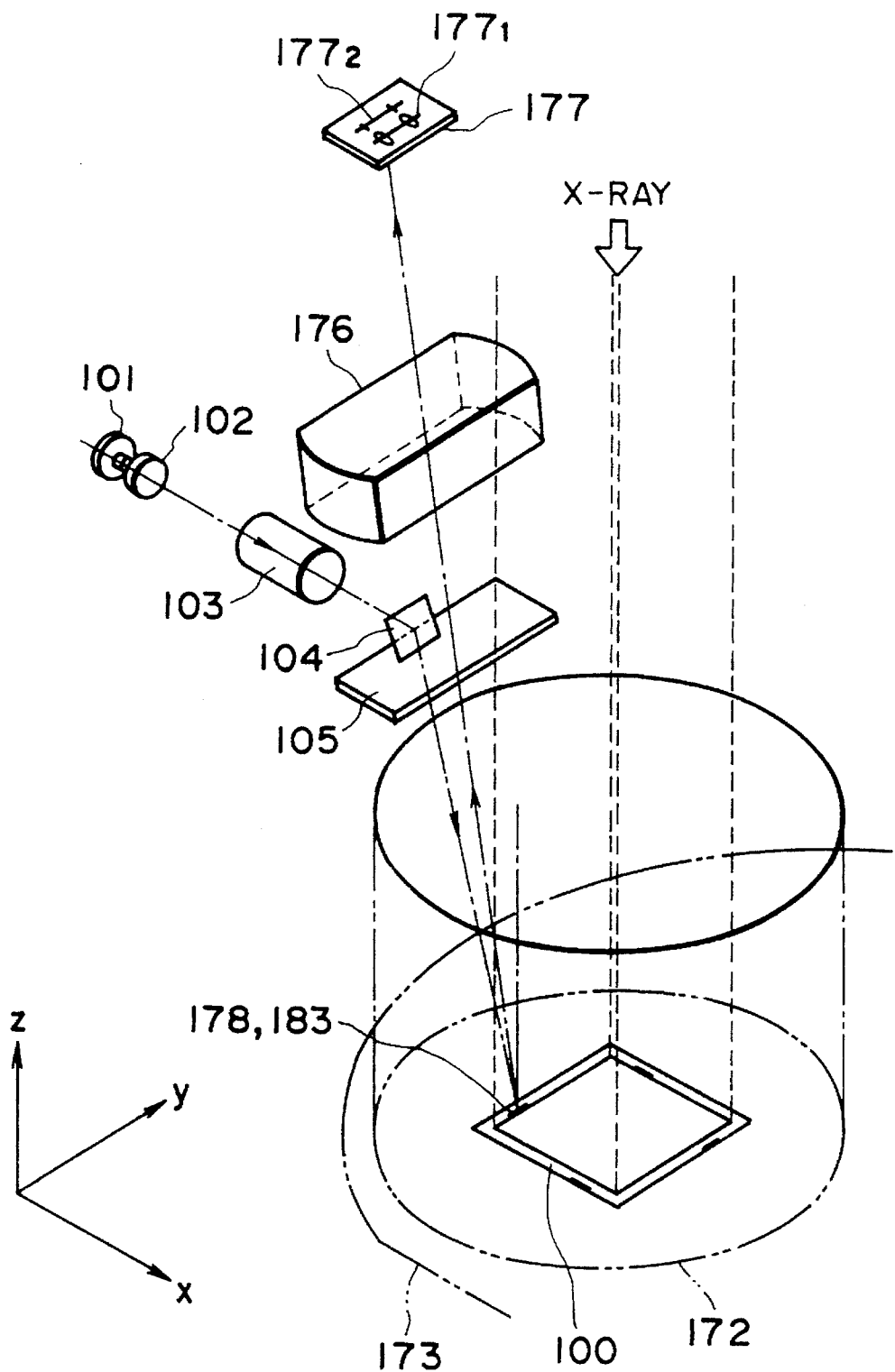
F I G. 15

POSITION DETECTING METHOD FOR DETECTING A POSITIONAL RELATIONSHIP BETWEEN A FIRST OBJECT AND A SECOND OBJECT

This application is a continuation of prior application, Ser. No. 08/013,330 filed Feb. 4, 1993, now abandoned.

FIELD OF THE INVENTION AND RELATED ART

This invention relates to a position detecting method and a semiconductor device manufacturing method using the same. The invention is particularly suitable for use in an exposure apparatus for manufacture of semiconductor devices, for example, when a fine electronic circuit pattern formed on the surface of a first object such as a mask or reticle (hereinafter simply "mask") is to be lithographically transferred to the surface of a second object such as a wafer, so as to detect any relative positional deviation of the mask and the wafer and then to position (align) them.

Conventionally in exposure apparatuses for manufacture of semiconductor devices, the relative alignment of a mask and a wafer is one important factor in respect to ensuring improved performance. Particularly, as for alignment systems employed in recent exposure apparatuses, submicron alignment accuracies or more strict accuracies are required for further enhancement of the degree of integration of each semiconductor device.

In many types of position detecting systems, features called "alignment marks" are provided on a mask and a wafer and, by utilizing the positional information obtainable therefrom, the mask and the wafer are brought into alignment with each other. As for the manner of executing the alignment, as an example, there is a method wherein the amount of relative deviation of the alignment marks of the mask and the wafer is detected on the basis of image processing. Another method is proposed in U.S. Pat. Nos. 4,037,969 and 4,514,858 and Japanese Laid-Open Patent Application, Laid-Open No. 157033/1981, wherein so-called zone plates are used as alignment marks upon which light is projected and wherein the positions of light spots formed on a predetermined plane by focused lights from the illuminated zone plates are detected.

Generally, an alignment method using a zone plate is relatively insensitive to any defect of an alignment mark and therefore assures relatively high alignment accuracies, as compared with an alignment method using a traditional alignment mark.

Japanese Laid-Open Patent Application, Laid-Open No. 74808/1990, filed in the name of the same assignee of the subject application proposes a position detecting system for detecting the position of a mask and a wafer by using physical optic elements of zone plates.

In this proposal, as a means for removing an error factor in the detection of deviation for alignment of first and second objects such as a mask and a wafer, in addition to a first light (first signal light) there is formed a second light (second signal light), both of which are used to assure high precision alignment.

More specifically, this system is so arranged that the position of incidence of the second signal light upon a sensor displaces with any inclination of the wafer surface, exactly in the same manner as the first signal light. Also, it is so arranged that the position of incidence of the second signal light displaces with any change in position of an alignment head, exactly in the same manner as the first signal light. This ensures that any change in relative position of the first and second signal lights upon the sensor is in principle dependent only upon the positional deviation or the mask and the wafer, and thus assures high-precision alignment.

In the position detecting system of the aforementioned Japanese Laid-Open Patent Application No. 74808/1990, when the mask and the wafer have no relative deviation, the sensor produces an alignment signal of a predetermined magnitude.

Here, the "predetermined magnitude" corresponds to a design magnitude for a mask and a wafer having no relative deviation. Actually, however, due to an error of the wafer or to errors in assembling various components such as a sensor, for example, the mask and the wafer may be correctly aligned when the sensor output is not equal to zero.

Thus, there is a possibility that the alignment signal (AA signal) when a mask and a wafer have no relative deviation bears an error of a certain magnitude, for some reasons.

On the other hand, conventionally in semiconductor device manufacturing apparatuses, the spacing between a mask and a wafer is measured by means of a spacing measuring system and, after controlling the spacing to a predetermined length (i.e., Z-axis alignment), a pattern of the mask is lithographically transferred to the wafer. This is done for high-precision lithography.

FIG. 21 is a schematic view showing a spacing measuring system such as proposed in Japanese Laid-Open Patent Application, Laid-Open No. 111402/1986. In this system, a mask (first object) M and a wafer (second object) W are disposed opposed to each other, and light is focused by a lens L1 at a point $P_S$ between the mask M and the wafer W.

Here, the light is reflected by the mask M surface and the wafer W surface, separately, and by a lens L2, the reflected lights are convergently projected at points $P_W$ and $P_M$ on a screen S surface, respectively. The spacing between the mask M and the wafer W is detected by detecting the spacing between the spots $P_W$ and $P_M$ of focused lights.

In the spacing measuring system shown in FIG. 21, the spacing between the mask and the wafer is detected on the basis of the correspondence of the spacing between the light spots on the sensor S with the spacing between the mask and the wafer. This necessarily results in that the detection of the absolute value of the spacing between the mask and the wafer is directly affected by an assembling error of the detecting system (such as the positional relationship between the lens L2 and the sensor S).

Thus, in order to detect the absolute value of the spacing between the mask and the wafer precisely, it is necessary to execute calibration for spacing of the mask and the wafer in a certain state by using a separate high-precision spacing detecting means. This of course results in complicatedness of the structure as a whole.

SUMMARY OF THE INVENTION

It is accordingly an object of the present invention to provide a method of detecting the positional relationship between first and second objects in a particular direction (such as X, Y or Z direction), while determining a certain reference free from an error.

It is another object of the present invention to provide a semiconductor device manufacturing method and/or apparatus wherein the above position detecting method is applied to mask-to-wafer alignment.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 12 is a graph for explaining the relationship between the spacing to be detected and the spacing between light spots on a sensor.

FIG. 13 is a graph for explaining the relationship between the spacing to be detected and the spacing between light spots on a sensor.

FIG. 15 is a schematic view of an embodiment of the present invention wherein a spacing measuring system of the present invention is incorporated into a semiconductor device manufacturing exposure apparatus.

DESCRIPTION OF THE PREFERRED EMBODIMENTS

Figure 1:
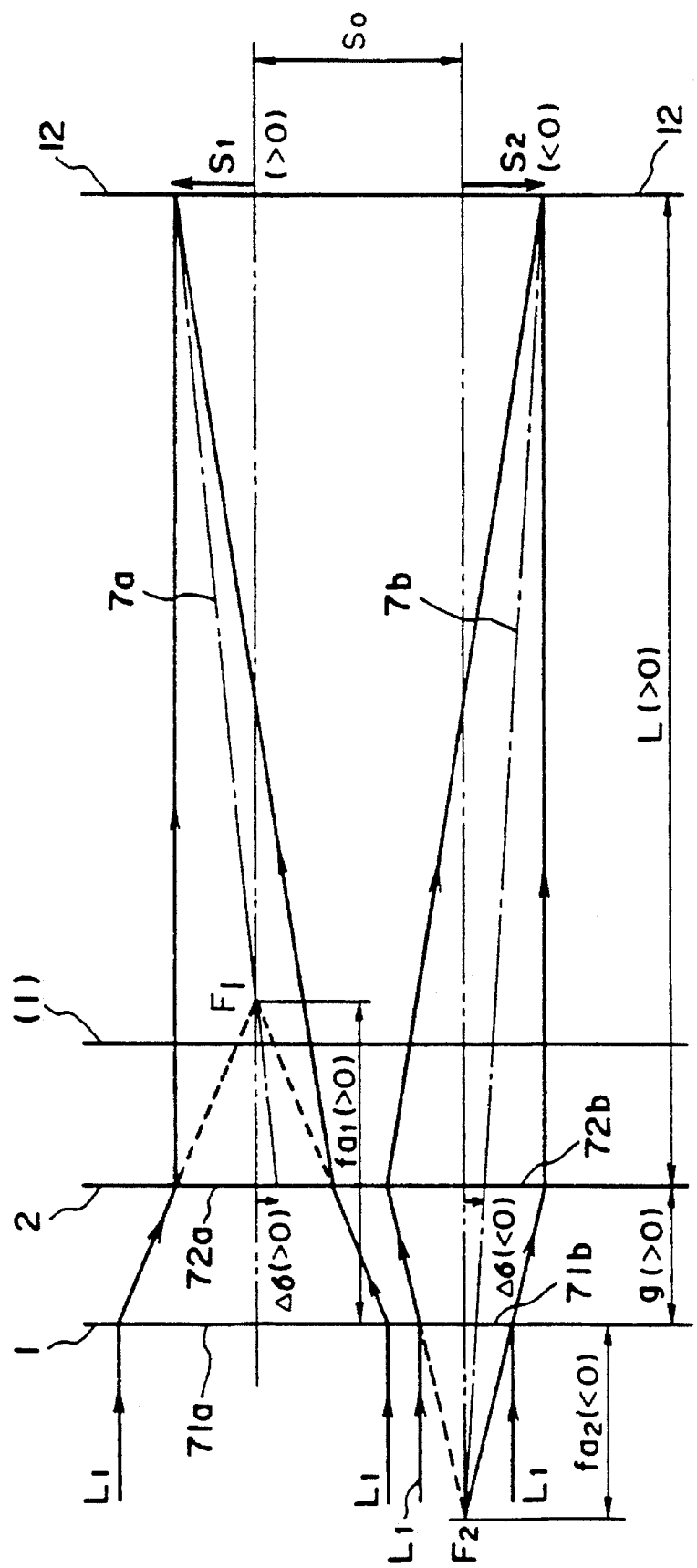
FIG. 1 is a schematic view of a main portion of a first embodiment of the present invention.
Figure 2:
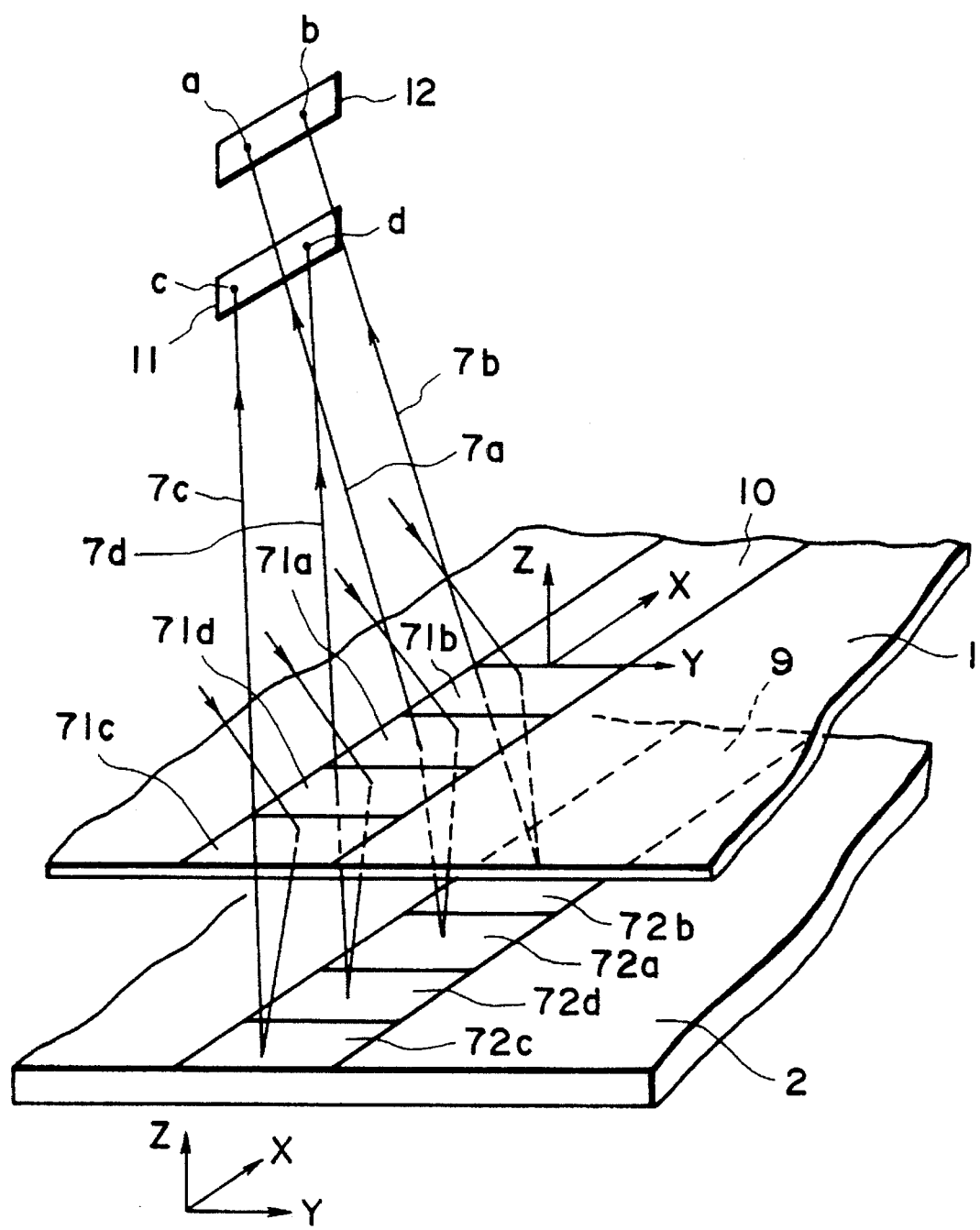
FIG. 2 is a perspective view of a portion of the first embodiment.
Figure 3:
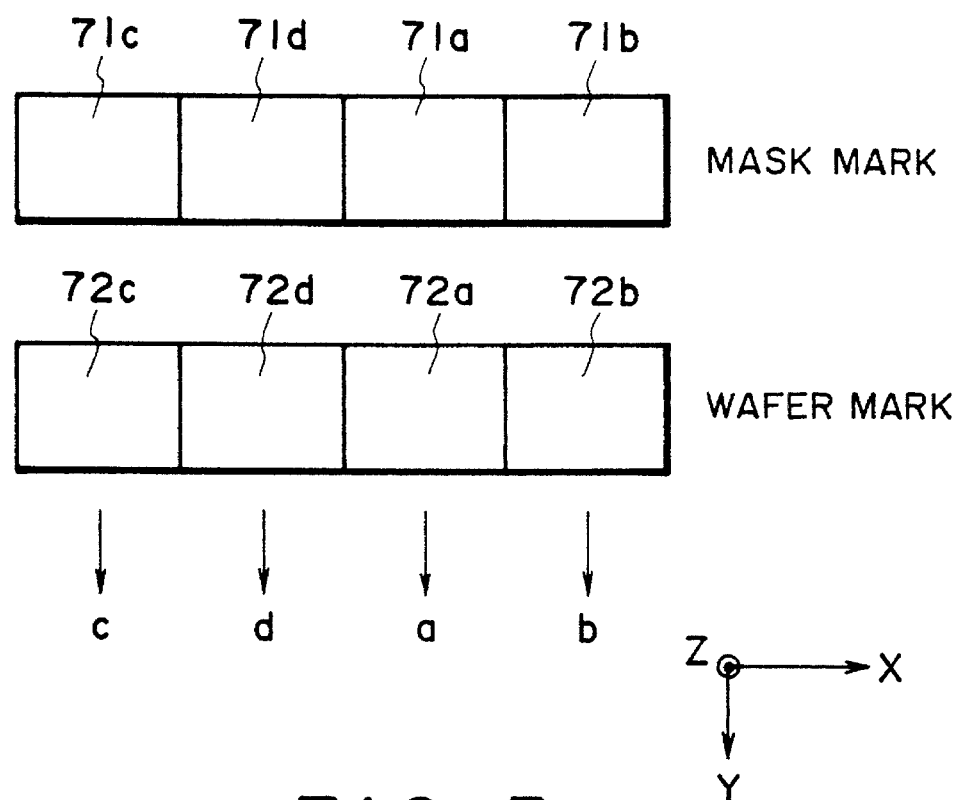
FIG. 3 is a schematic view of alignment marks and alignment patterns formed on a mask and a wafer, respectively.
Figure 4:
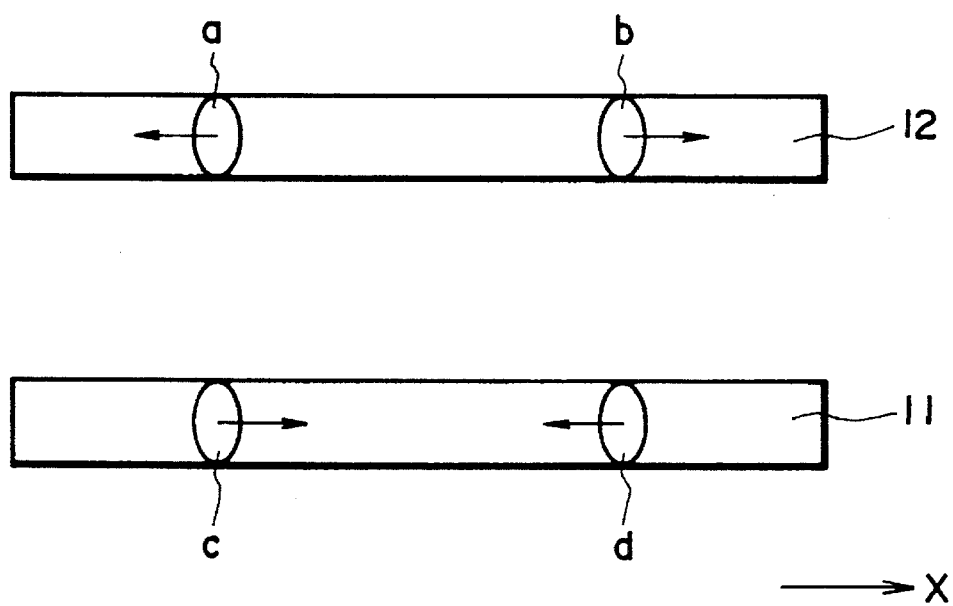
FIG. 4 is a schematic view of light impinging on sensors of FIG. 2.
Figure 5:
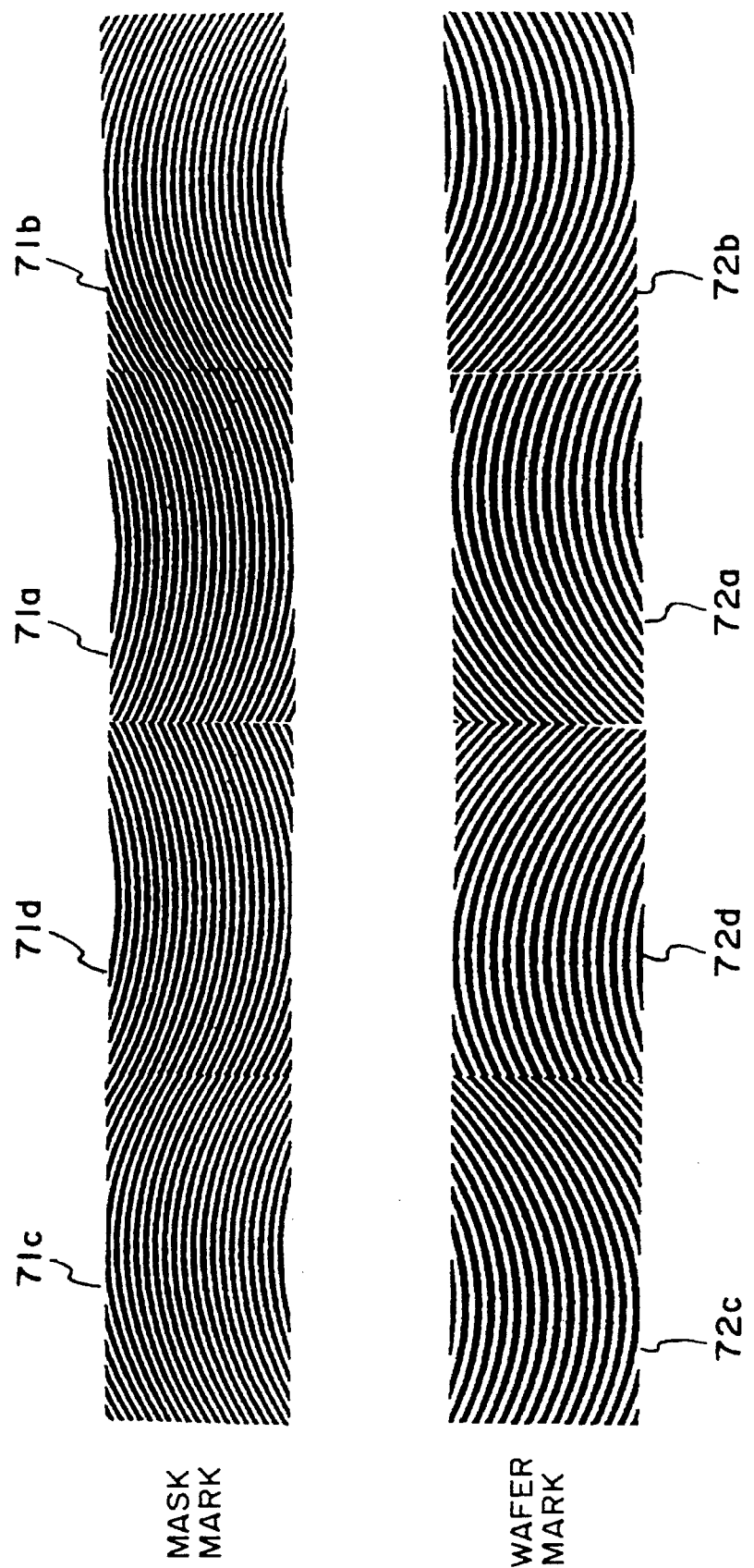
FIG. 5 is an enlarged view of alignment marks and alignment patterns of FIG. 3.

FIG. 1 is a schematic view for explaining the principle of the present invention, wherein some components are expanded for illustration. FIG. 2 is a perspective view of a main portion of a first embodiment of the present invention, which is based on the structure of FIG. 1. FIG. 3 is a schematic view of alignment marks and alignment patterns provided on a mask and a wafer of FIG. 2. FIG. 4 is a schematic view, showing light impinging on the surface of a sensor of FIG. 2. FIG. 5 is an enlarged view of alignment marks and alignment patterns of FIG. 3.

Denoted in the drawings at 1 is a first object (mask) and denoted at 2 is a second object (wafer), any positional deviation between which is to be detected.

In FIG. 1, since the light passing through the first object 1 and reflected by the second object 2 passes again through the first object 1. FIG. 1 illustrates the first object 1 twice. Denoted at 71a is an alignment mark (first alignment mark) provided on the first object 1, and denoted at 72a is an alignment pattern (first alignment pattern) provided on the second object 2. They are provided for production of a first signal. Similarly, denoted at 71b is an alignment mark (second alignment mark) provided on the first object 1, and denoted at 72b is an alignment pattern (second alignment pattern) provided on the second object 2. They are provided for production of a second signal.

Only for the sake of convenience, two (71a and 71b) of four alignment marks (71a–71d) and two (72a and 72b) of four alignment patterns (72a–72d) provided on the mask 1 and the wafer 2, respectively, are illustrated in FIG. 1. Also, in FIG. 1, the alignment patterns 72a and 72b are illustrated as being optically equivalent transmission type patterns.

Each of the alignment marks 71a–71d and alignment patterns 72a–72d has a function of a physical optic element such as a diffraction grating or a grating lens having a one-dimensional or two-dimensional lens function.

Denoted at 9 is a wafer scribe line, and denoted at 10 is a mask scribe line. The alignment marks and alignment patterns are formed on these scribe lines, respectively. Denoted at 7a and 7b are first and second signal lights, for the first and second alignment purposes. Denoted at 7c and 7d are third and fourth signal lights, corresponding to the first and second signal lights 7a and 7b, respectively.

The alignment marks 71a and 71b define one mark group, while the alignment marks 71c and 71d define another mark group. Alignment patterns 72a and 72b define one pattern group, while the alignment patterns 72c and 72d define another pattern group.

In this embodiment, as shown in FIG. 5, the the mask (first object) 1 is provided with two alignment marks 71a and 71d of light converging type (convex) and two alignment marks 71b and 71c of light diverging type (concave). Also, the wafer (second object) 2 is provided with two alignment patterns 72a and 72d of light diverging type (concave) and two alignment patterns 72b and 72c of light converging type (convex). The alignment marks 71a–71d on the mask 1 surface are correlated with the alignment patterns 72a–72d on the wafer 2 surface, respectively.

For example, light incident on the alignment mark 71a on the mask 1 surface impinges on the alignment pattern 72a on the wafer 2 surface and, then, it impinges on a sensor 12 (which may comprise linear CCD having corresponding arrayed light receiving elements) as a spot a. Here, the light is influenced by the optical function of a convex-concave system.

In this embodiment, the alignment mark 71a and the alignment pattern 72a cooperate with each other to provide an alignment system AA1 of convex-concave system, having light converging and diverging function. The light passing through this alignment system AA1 forms the spot a on the sensor 12, such as shown in FIG. 4.

Similarly, the alignment mark 71b and the alignment pattern 72b cooperate to provide an alignment system BB1 of concave-convex system, having light diverging and converging function. The light passing through this alignment system BB1 forms a spot b on the sensor 12.

Also, the alignment mark 71c and the alignment pattern 72c cooperate to provide an alignment system CC1 of concave-convex system, and the light passing through this alignment system CC1 forms a spot c on a sensor 11 which has a similar structure as the sensor 12.

Further, the alignment mark 71d and the alignment pattern 72d cooperate to provide an alignment system DD1 of convex-concave system, and the light passing through this alignment system DD1 forms a spot d on the sensor 11.

In this embodiment, relative to the two alignment systems AA1 and BB1, the other two alignment systems DD1 and CC1 have their positions and optical functions arranged symmetric.

FIG. 5 illustrates the alignment marks and the alignment patterns of FIG. 3. The sensors 11 and 12 are components of a detecting means.

Next, the principle of the detecting method of this embodiment, for detecting any relative positional deviation of the mask 1 and the wafer 2, will be explained in conjunction with FIG. 1.

In FIG. 1, denoted at L1 is an input light. Denoted at 7a and 7b are first and second signal lights for the first and second alignment purposes, as described. Denoted at 12 is a sensor for detecting the first and second signal lights. For convenience, the distance to the sensor 12 from the second object 2 is denoted by L. Also, the distance between the first and second objects 1 and 2 is denoted by g; the focal lengths of the alignment marks 71a and 71b are denoted by $f_{a1}$ and $f_{a2}$; the relative positional deviation of the first and second objects 1 and 2 is denoted by $\Delta\sigma$; and the displacements of the gravity centers of the first and second signal lights upon the sensor 12 from the positions to be assumed when the first and second objects are correctly aligned with each other, are denoted by $S_1$ and $S_2$. The alignment light inputted to the first object 1 is assumed as plane wave (for convenience), and the signs are such as shown in the drawing.

The displacements $S_1$ and $S_2$ of the gravity centers of the signal lights each can be determined geometrically, as an intersection between the light receiving surface of the sensor 12 and a straight line that connects the focal point $F_1$ ($F_2$) of the alignment mark 71a (71b) and the optical axis center of the alignment pattern 72a (72b). Therefore, the displacements $S_1$ and $S_2$ of the gravity centers of the signal lights 7a and 7b are in opposite directions, as is readily understood from FIG. 1, provided that the alignment patterns 72a and 72b have optical imaging magnifications of opposite signs. Quantitatively, they can be expressed as:

$$S_1=(L-f_{a1}+g)/(f_{a1}-g)\times\Delta\sigma$$

$$S_2=(L-f_{a2}+g)/(f_{a2}-g)\times\Delta\sigma$$

And, the deviation magnifications $\beta_1$ and $\beta_2$ can be defined as $\beta_1=S_1/\Delta\sigma$ and $\beta_2=S_2/\Delta\sigma$. Thus, where the deviation magnifications have opposite signs, with a deviation between the first and second objects 1 and 2 the lights 7a and 7b displaces by distances $S_1$ and $S_2$, respectively, along the light receiving surface of the sensor 12.

For example, deviation magnifications of opposite signs may be provided if the following relation is satisfied:

$$[(L-f_{a1}+g)(f_{a2}-g)]/[(L-f_{a2}+g)(f_{a1}-g)]<0$$

One practically appropriate structural condition may be:

$L>>|f_{a1}|$ $f_{a1}/f_{a2}<0$ $|f_{a1}|>g$ $|f_{a2}|>g$

Namely, the structure is such that, as compared with the focal lengths $f_{a1}$ and $f_{a2}$ of the alignment marks 71a and 71b, the distance L to the sensor 12 is made large while the spacing g between the first and second object 1 and 2 is made small; and also one of the alignment marks comprises a convex lens while the other comprises a concave lens.

In the upper part of FIG. 1, the light incident on the alignment mark 71a is transformed into a convergent light and, before it reaches the point $F_1$ of convergence, the light is received by the alignment pattern 72a by which it is imaged on the sensor 12. Here, the focal length $f_{b1}$ of the alignment pattern 72a is set to satisfy the following lens equation:

$$1/(f_{a1}-g)+1/L=-1/f_{b1}$$

Similarly, in the lower part of FIG. 1, the input light to the alignment light is transformed thereby into a light diverging from the point $F_2$ at the light input side, which light is influenced by the alignment pattern 72b and is imaged on the sensor 12. Here, the focal length $f_{b2}$ of the alignment mark 72b is set to satisfy:

$$1/(f_{a2}-g)+1/L=-1/f_{b2}$$

With the structural conditions such as above, the imaging magnification of the alignment mark 71a to the focused image is positive, as clearly seen in the drawing. The deviation $\Delta\sigma$ of the second object 2 and the displacement $S_1$ of the light spot on the sensor 12 are in opposite directions, and the deviation magnification $\beta_1$ as defined hereinbefore is negative. Similarly, the imaging magnification of the alignment pattern 72b to the point image (virtual image) of the alignment mark 71b is negative. Also, the deviation $\Delta\sigma$ of the second object 2 and the displacement $S_2$ of the light spot on the sensor 1 are in the same direction, and the deviation magnification $\beta_2$ is positive.

As a result, with a relative positional deviation $\Delta\sigma$ of the first and second objects 1 and 2, the produced displacements $S_1$ and $S_2$ of the signal lights of the alignment system AA1 (alignment mark 71a and alignment pattern 72a) and the alignment system BB1 (alignment mark 71b and alignment pattern 72b) are in opposite directions.

In other words, if in the arrangement of FIG. 1 the first object 1 is spatially fixed while the second object 2 is displaced downwardly as viewed in the drawing, the light spot spacing on the sensor in correct alignment state is enlarged. If, to the contrary, it is displaces upwardly, the light spot spacing is narrowed.

In this embodiment, the mask (first object) is provided with four alignment marks having optical functions as described whereas the wafer (second object) is provided with four alignment patterns having optical functions as described. By using such alignment marks and alignment patterns and on the basis of the position detecting principle as illustrated in FIG. 1, the position of the mask and wafer is detected in the manner to be described later.

Now, the manner of detecting a relative positional deviation of a mask and a wafer in this embodiment, will be explained.

In the arrangement of alignment marks and alignment patterns as shown in FIGS. 2 and 3, if the mask or wafer is deviated in the X-axis direction, the spots formed on the sensors 11 and 12 are such as shown in FIG. 4. If, in this case, the mask and the wafer are relatively displaced in the X-axis direction, the spots a, b, c and d on the sensors 11 and 12 of FIG. 4 displace as depicted by arrows.

Figure 6:
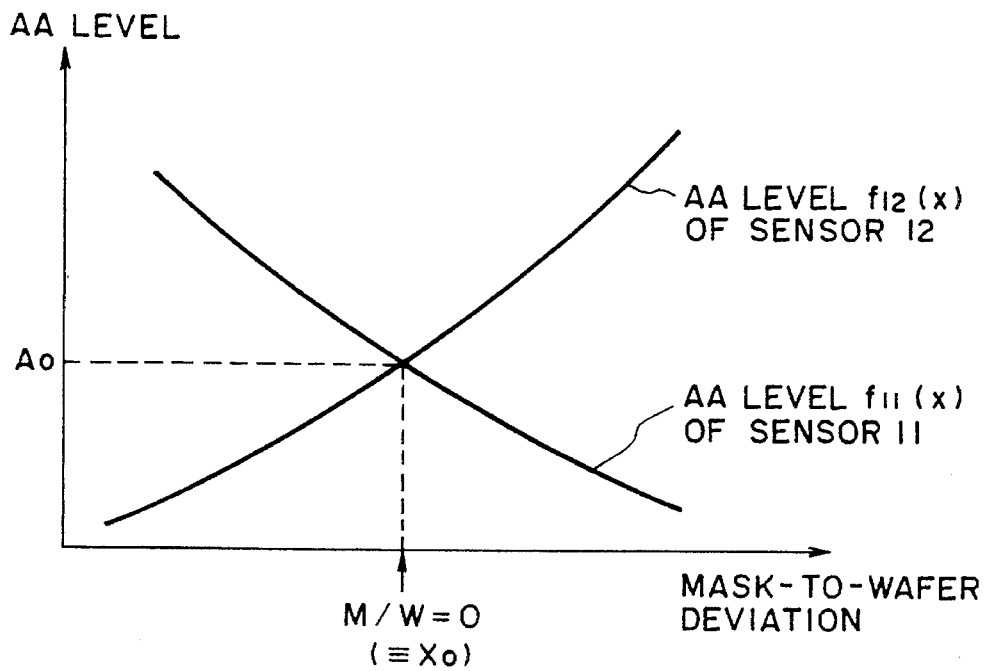
FIG. 6 is a graph for explaining the alignment characteristics (AA characteristics) as obtainable from the two sensors of FIG. 2.

FIG. 6 shows changes of AA value (magnitude of a detected signal corresponding to a deviation of the mask and wafer) of the sensors 11 and 12 with relative displacement of the mask and wafer. As the mask and wafer relatively displace in the X-axis direction, the AA value changes with the characteristic as shown in FIG. 6.

In this embodiment, the alignment marks and the alignment patterns such as shown in FIGS. 3 and 5 are provided symmetrically with respect to the central axes of the sensors 11 and 12 (axes parallel to the Y axis) or to the central axes of the alignment mark area and the alignment pattern area on the mask and the wafer (axes parallel to the Y axis).

Namely, the marks 71a and 71d have essentially the same characteristic (pattern shape, pattern size, focal length, etc.); the patterns 72a and 72d have essentially the same characteristic; the marks 71b and 71c have essentially the same characteristic; and the patterns 72b and 72c have essentially the same characteristic. Also, the distance between the optical axes of the marks 71a and 71b is equal to that of the marks 71c and 71d, while the distance between the optical axes of the patterns 72a and 72b is equal to that of the patterns 72c and 72d.

Thus, the AA value changes in such manner that: where the mask-to-wafer deviation is taken on the X axis while the corresponding AA value is represented by f(x), when the sensors 11 and 12 show the same AA value, the outputted mask-to-wafer deviation is zero. Where this deviation is denoted by $x_0$, the alignment marks and the alignment patterns are so designed that the sensors 11 and 12 show AA value characteristics $f_{11}(x)$ and $f_{12}(x)$ which are symmetric with respect to the axis of $x=x_0$.

As described, the mask and the wafer have formed thereon alignment marks and alignment patterns, respectively, which are provided symmetrically and in combination of convergence (convex) and divergence (concave), thus making the detection characteristic symmetrical. This assures that the sensors 11 and 12 show the same AA value, thus ensuring accurate determination of the absolute origin when the mask-to-wafer deviation is zero.

As an example, the mask and wafer may be displaced little by little and corresponding AA values of the sensors 11 and 12 may be detected, to obtain the characteristic of FIG. 6. In this occasion, the mask-to-wafer deviation is zero when the sensors 11 and 12 show the same AA value. On the basis of this, the relative position of the mask and the wafer can be determined.

The point of coincidence of the AA values of the sensors 11 and 12 of FIG. 6 is always at the point M/W=0 even if the AA value of the sensor 11 or of the sensor 12 changes due to some error (as having been discussed in the introductory part of the Specification). This is because, by such an error, the inclination of the change of the AA value of the sensor 11 (as depicted by a curve in the drawing) with positional deviation and the inclination of the change of the AA value of the sensor 12 (as depicted by another curve in the drawing) with positional deviation, shift symmetrically (in opposite directions) with each other. Also, by such an error, the curves of change of the sensors 11 and 12 shift vertically in the same direction.

Figure 7:
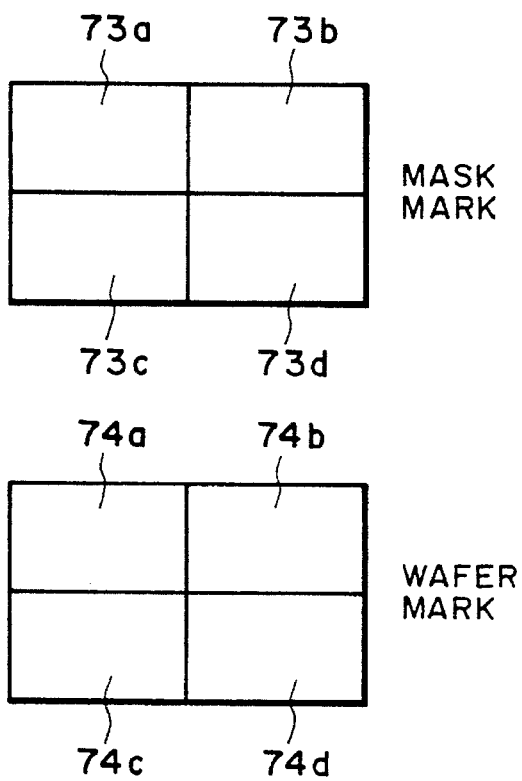
FIG. 7 is a schematic view of modified forms of alignment marks and alignment patterns usable in the present invention.

FIG. 7 is a schematic view of another form of alignment mark arrangement to be provided on a mask and a wafer, in accordance with the present invention. In this embodiment, four alignment marks and four alignment patterns are disposed two-dimensionally on the mask and the wafer, respectively.

The alignment mark 73a and the alignment pattern 74a cooperate with each other to define the spot a of FIG. 4; the alignment mark 73b and the alignment pattern 74b cooperate to define the spot b; the alignment mark 73c and the alignment pattern 74c cooperate to define the spot c; and the alignment mark 73d and the alignment pattern 74d cooperate to define the spot d. Thus, essentially the same advantageous effect as attainable with the structure of FIG. 3 is obtainable.

Disposition of alignment marks and alignment patterns is not limited to the forms described above, and it may be modified in various ways.

Figure 8:
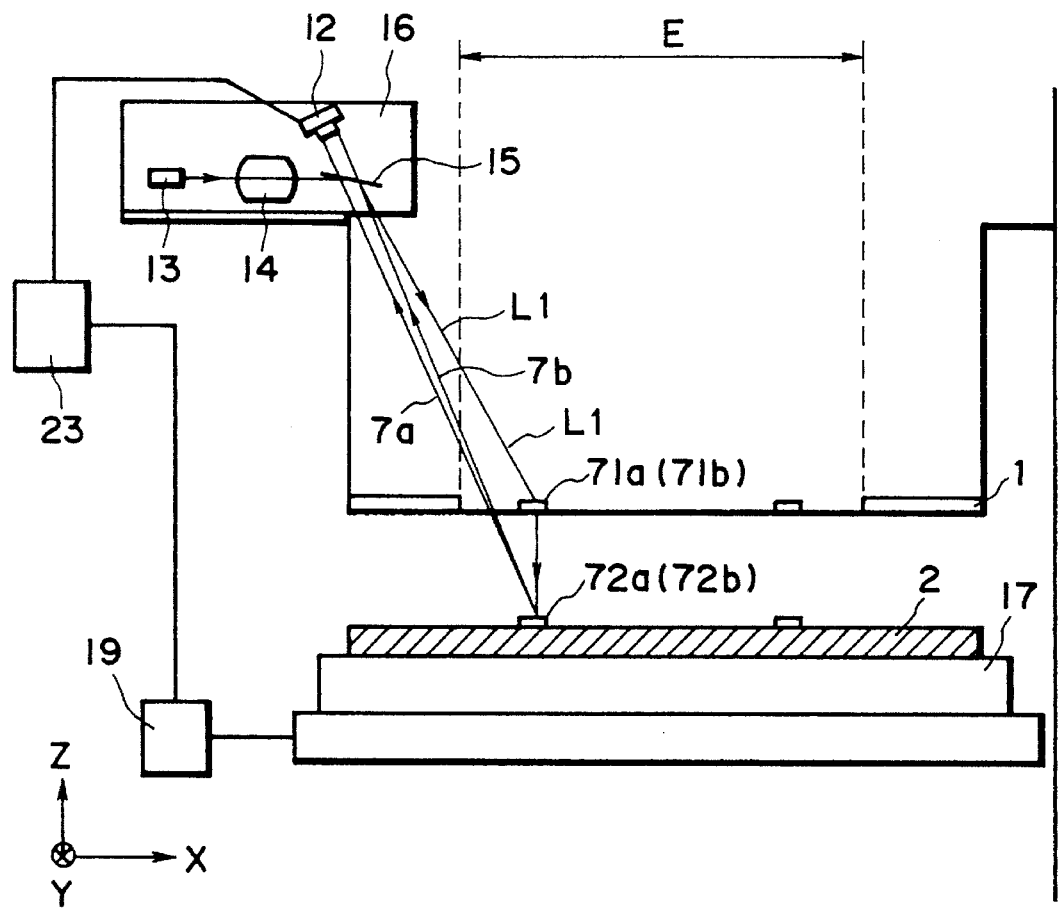
FIG. 8 is a schematic view of an embodiment of the present invention, wherein the invention is applied to a semiconductor device manufacturing exposure apparatus of proximity type.

Now, description will be made on those components illustrated in FIG. 8 which shows peripheral structural elements in an embodiment wherein the invention is applied to a semiconductor device manufacturing exposure apparatus of proximity type. In the drawing, for convenience, only lights 7a and 7b, a sensor 12, alignment marks 71a and 71b, and alignment patterns 72a and 72b are illustrated each as a representative.

Denoted in the drawing at 13 is a light source; at 14 is a collimator lens (or a beam diameter transforming lens); at 15 is projected light deflecting mirror; at 16 is a pickup housing; at 17 is a wafer stage; at 23 is a signal processing means; at 19 is a wafer stage drive control means; and at E is the width of exposure light. The light source 13 and the collimator lens 14 are a part of light projecting means.

Denoted at 1 is a first object which may be a mask, for example. Denoted at 2 is a second object which may be a wafer, for example, to be aligned with the mask 1. Alignment marks 71a and 71b and alignment patterns 72a and 72b each may be provided by a grating lens such as a one-dimensional or two-dimensional Fresnel zone plate. These marks and patterns are formed on scribe lines 10 and 9 on the mask 1 and the wafer 2, respectively. Denoted at 7a is first light, and denoted at 7b is second light. These lights (signal lights) 7a and 7b correspond respectively to those of the light L1: having been emitted from the light source 13; having been collimated by the lens system 14 into a predetermined beam diameter; having been deflected by the mirror 15; and having been influenced by the alignment mark 71a (71b) and the alignment pattern 72a (72b).

While a semiconductor laser is used in this embodiment, as the type of usable light source, it may be a coherent light source such as a He—Ne laser or Ar laser, or it may be an incoherent light source such as a light emitting diode.

The sensor 12 receives the first signal light 7a and the second signal light 7b. Here, the projected light L1 is incident on the alignment mark 71a (71b) on the mask 1 surface, at a predetermined angle. The incident light is transmissively diffracted thereby. Then, the light is reflectively diffracted by the alignment pattern 72a (72b) and is projected on the light receiving surface of the sensor 12.

The signal processing means 23 receives a corresponding signal from the sensor 12 and detects the gravity center position, upon the sensor 12 surface, of the alignment light incident on the sensor 12 surface. Thus, on the basis of the output signal from the sensor 12, the signal processing means determines the positional deviation of the mask 1 and the wafer 2.

Here, the term "gravity center of light" means such a point that, when in the cross-section of the light a position vector of each point in the section is multiplied by the light intensity at that point and the thus obtained products are integrated over the entire section, the integrated level has a "zero vector". As an alternative, however, the position of such a point corresponding to the peak of light intensity may be used.

Figure 9:
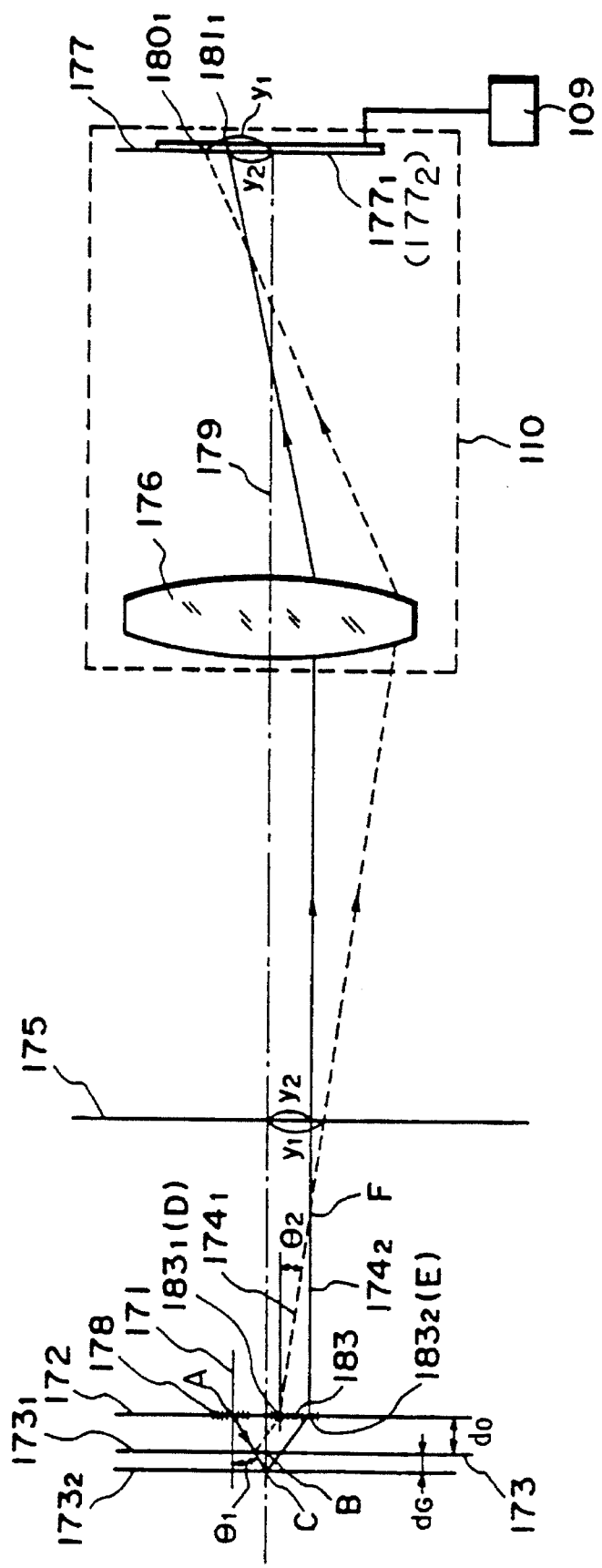
FIG. 9 is a schematic view of a portion of an optical system of a spacing measuring system according to an embodiment of the present invention.

FIG. 9 is a schematic view of a main portion of an optical system of an embodiment of the present invention wherein the invention is applied to a measuring system for measuring the spacing between a mask and a wafer, in a semiconductor device manufacturing exposure apparatus.

Figure 10:
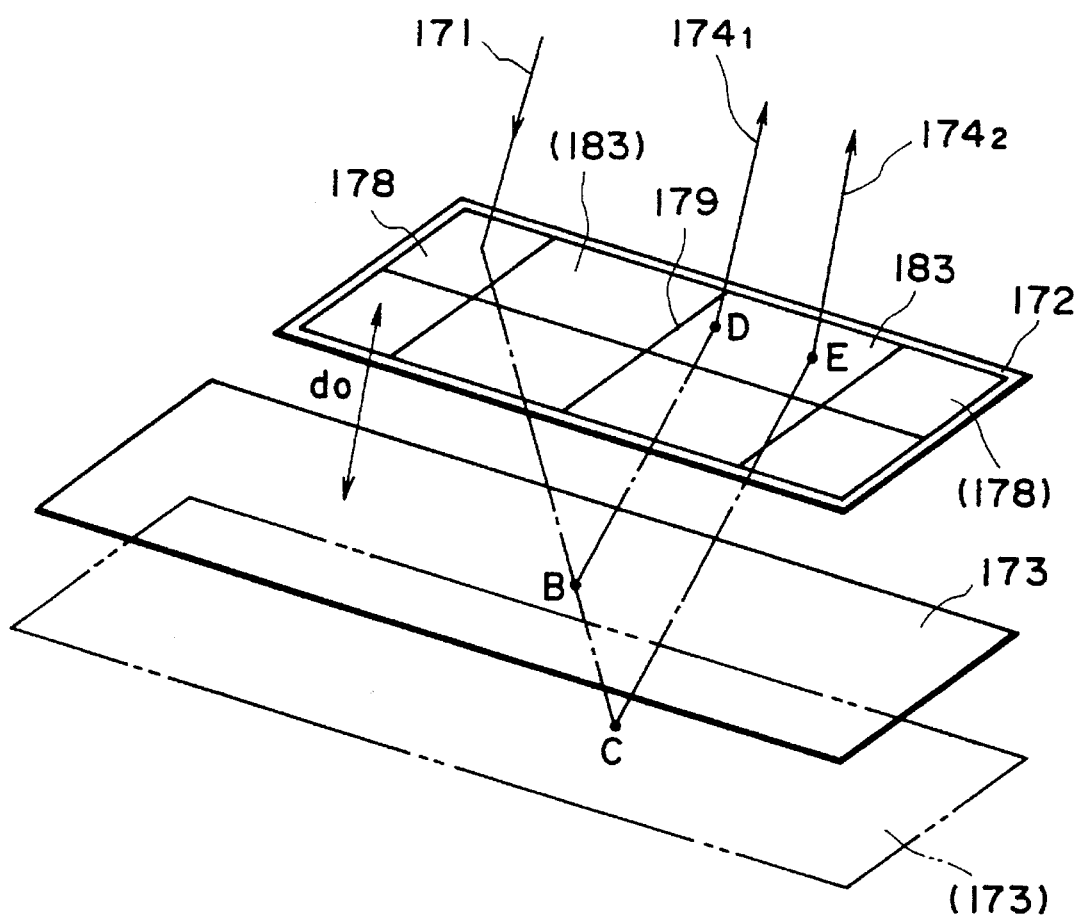
FIG. 10 is a schematic view of physical optic elements of FIG. 9.

Denoted in the drawing at 171 is light from a light source such as an LED, a He—Ne laser or a semiconductor laser. Denoted at 172 is a first object which may be a mask, for example. Denoted at 173 is a second object which may be a wafer, for example. The mask 172 and the wafer 173 are placed opposed to each other, with a spacing $d_0$ as illustrated in FIG. 10.

Reference numeral $173_1$ denotes the position of the wafer 173 when the spacing between the mask 172 and the wafer 173 is equal to $d_0$. Reference numeral $173_2$ denotes the position of the wafer 173 when the spacing between the mask 172 and the wafer 173 is equal to $d_0+d_G$.

Figure 16:
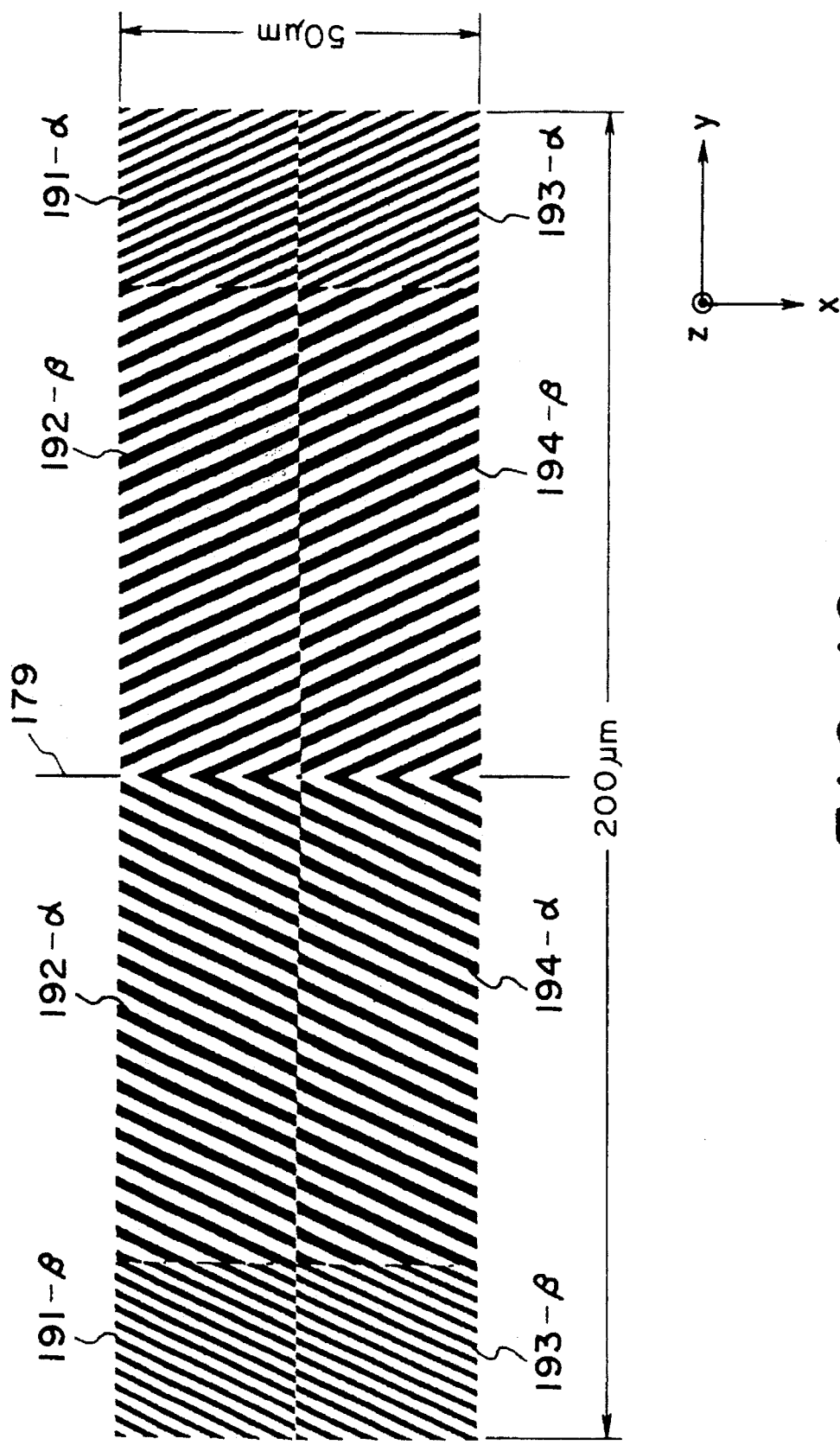
FIG. 16 is an enlarged view of physical optic elements on the surface of a mask of FIG. 15.

Denoted at 178 and 183 are first and second physical optic elements provided in a portion of the mask 172 surface. The structure and arrangement of them are illustrated in FIG. 16, to be discussed later. Each of these physical optic elements 178 and 183 comprises a diffraction grating, a zone plate or a grating lens, for example. Denoted at 176 is a condensing lens (hereinafter simply "lens") having given focal length.

Denoted at 177 is a light receiving means (hereinafter simply "sensor") comprising first and second detecting means which may include two line sensors $177_1$ and $177_2$ or PGDs, for detecting the gravity center position of an input light upon the sensor surface.

Here, the term "gravity center of light" means such a point that, when in the cross-section of the light a position vector of each point in the section is multiplied by the light intensity at that point and the thus obtained products are integrated over the entire section, the integrated level has a "zero vector". As an alternative, however, the position of such a point corresponding to the peak of light intensity may be used.

Reference numeral 179 denotes the optical axis. While only one measuring system is illustrated in FIG. 9, actually there are provided two measuring systems which are symmetrical with each other with respect to the optical axis 179 and which include gratings (178, 183) of the same structure. For convenience, one of the measuring systems which is below the optical axis 179 is illustrated in FIG. 9.

Denoted at 109 is a signal processing circuit which serves to detect the gravity center position of the light incident on the surface of the light receiving means 177, by using the signals from the two line sensors $177_1$ and $177_2$, and also it serves to determine by calculation the distance $d_0$ between the mask 172 and the wafer 173 in the manner to be described later.

Denoted at 110 is a light pickup which accommodates therein the condensing lens 176, the light receiving means 177 and (as desired) the signal processing circuit 109. It is relatively movable relative to the mask 172 or the wafer 173.

In this embodiment, monochromatic light or quasi-monochromatic light 171 (wavelength λ=830 nm) from a semiconductor laser (not shown) is perpendicularly incident at point A on the surface of a first Fresnel zone plate (hereinafter simply "FZP") 178 on the mask 172. Diffraction light of a predetermined order or orders, diffracted at an angle $\theta_1$ by the first FZP 178, is reflected at point B (C) on the wafer 173.

Light $174_1$ is the reflected light as the wafer 173 is placed at the position $173_1$ close to the mask 172, while light $174_2$ is the reflected light as the wafer 173 is placed at the position $173_2$, displaced from the position $173_1$ by a distance $d_G$. The reflected light from the wafer 173 is then incident at point D (E as the wafer is at position $173_2$) on the second FZP 183 on the first object 172.

The second FZP 183 has an optical function for changing the angle of emission of the diffraction light in accordance with the position of incidence of the input light.

The diffraction light $174_1$ of a predetermined order or orders, being diffracted at an angle $\theta_2$ by the second FZP 183, is then directed by the condensing lens 176 onto the surface of the light receiving means 177. It is assumed for convenience that the condensing lens 176 is able to place the position of the plane 175 and the sensor 177 in an optically conjugate unit-magnification imaging relationship (unit magnification is not a requisition).

Then, on the basis of the gravity center position of the light $174_1$ ($174_2$ as the wafer is at position $173_2$) incident on the line sensor $177_1$ of the light receiving means 177, the spacing between the mask 172 and the wafer 173 is determined by calculation.

In this embodiment, each of the first and second FZPs 178 and 183 provided on the mask 172 is formed with a predetermined or preset pitch. Therefore, the diffraction angle $\theta_1$ of the diffraction light of a predetermined order or orders (e.g. ±1st orders) diffracted by the FZP 178 as well as the diffraction angle $\theta_2$, at a predetermined position of incidence, of such diffraction light diffracted by the FZP 183, can be determined beforehand.

In this embodiment, two measuring systems are provided in a symmetric relation with respect to the optical axis 179. Thus, with regard to the spacing between the mask 172 and the wafer 173, if the wafer 173 is at the position $173_1$, on the sensor 177 (e.g. the line sensor $177_1$ of FIG. 17) there are formed light spots $180_1$ and $180_1$ (100-α and 100-β on the line sensor $177_1$ of FIG. 17) which are symmetric with each other with respect to the optical axis 179 and which are spaced by a distance $y_1$ from the optical axis 179. The spacing (spacing 191 in FIG. 17) between the two light spots $180_1$ and $180_1$ formed on the sensor $177_1$ surface symmetrically with respect to the optical axis 179, provides the spacing $d_o$ between the mask 172 and the wafer 173.

Figure 11:
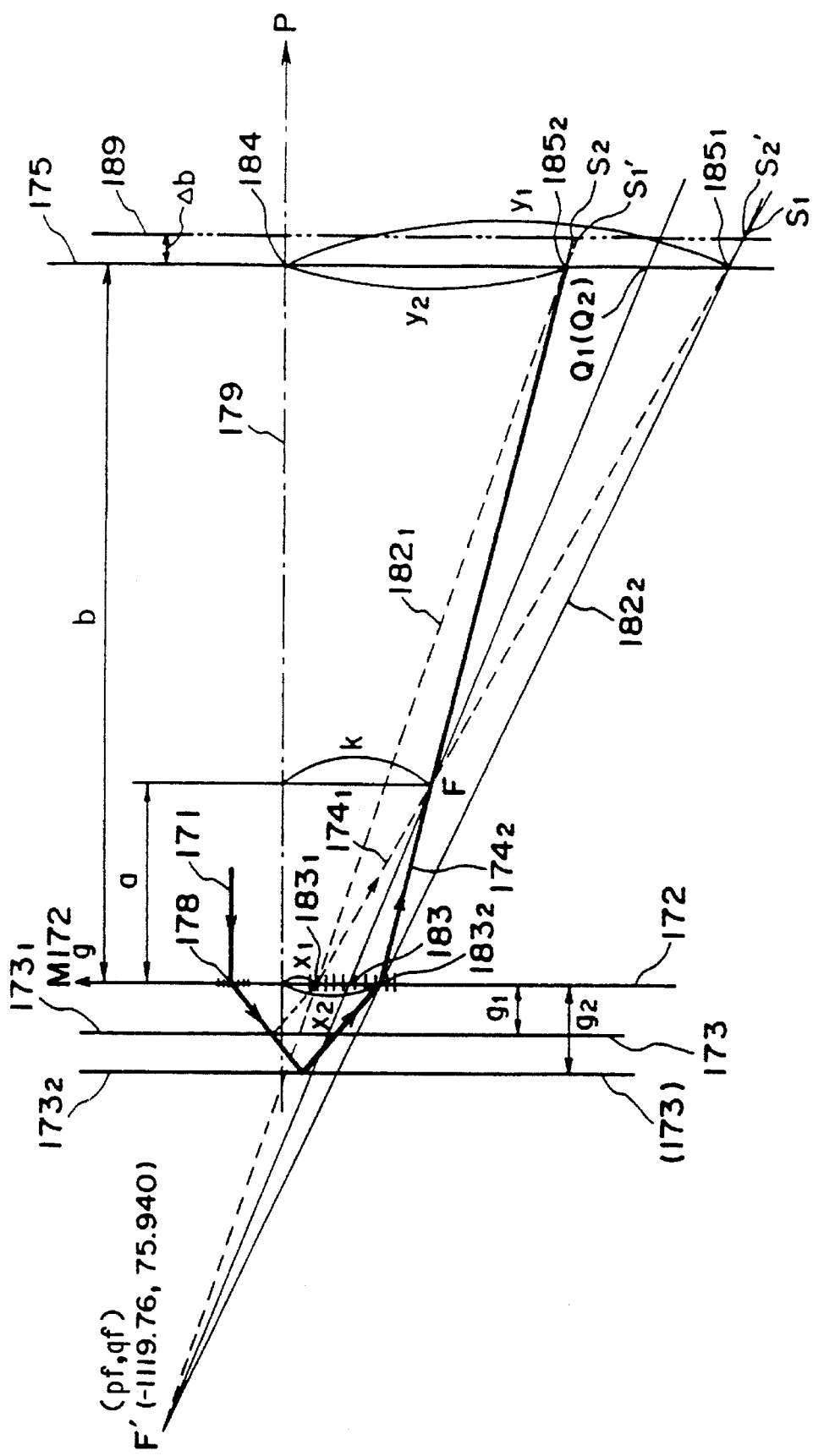
FIG. 11 is a schematic view for explaining the principle of measurement in a spacing measuring system of the present invention.

FIG. 11 is a schematic view for explaining the principle of measurement of a spacing measuring device according to the present invention. In this drawing, the portion of FIG. 9 at the left hand side of the plane 175 is illustrated in an enlarged scale.

Now, the principle of measurement in accordance with the present invention will be explained with reference to FIGS. 9 and 11. In FIG. 11, since the plane 175 and the sensor 177 are in a unit-magnification conjugate relationship with each other with respect to the lens 176, the distance from the optical axis 179 of the light spot to be formed on the sensor 177 may be considered while taking the sensor 177 as being located on the plane 175. However, due to inversion with respect to the lens 176, the position is inverted vertically with respect to the optical axis.

When in FIG. 11 the wafer 173 is at the position $173_1$, diffraction light produced by the diffraction grating 178 on the mask 172 is reflected (regularly) by the wafer 173 and it impinges at the position $183_1$ on the diffraction grating 183. When the wafer 173 is at the position $173_2$, the light diffracted by the diffraction grating 178 is regularly reflected by the wafer 173 and it impinges at the position $183_2$ on the diffraction grating 183.

Assuming now that the positions $183_1$ and $183_2$ are spaced from the optical axis 179 by distances $x_1$ and $x_2$ (micron), respectively, and that the diffraction grating 183 has a diffracting function of converging light at the point F, then, while taking the optical axis position on the mask 172 as being an origin, in a coordinate system (p, q):

F(a, k) (unit: micron)

The point 184 is, if it is at the optical axis 179 position on the plane 175, defined as a point 184(b, o).

Here, if the distances from the optical axis of the lights 174$_1$ and 174$_2$ as they are incident on the plane 175 are $y_1$ and $y_2$ (wherein $y_1$ and $y_2$ is larger than zero), assuming that $k > x_2 > x_1$, then:

$$(|k|-|x_1|)/a = (y_1-|k|)/(b-a)$$

Therefore, $$y_1 = [(b-a)/a] \times (|k|-|x_1|) + |k| \quad (1)$$

Also, $$(|k|-|x_2|)/a = (y_2-|k|)/(b-a)$$

Therefore, $$y_2 = [(b-a)/a] \times (|k|-|x_2|) + |k| \quad (2)$$

Since $|x_1|$ and $|x_2|$ correspond to the gap (spacing) between the mask 172 and the wafer 173, it is seen that equations (1) and (2) are in a linear relationship with the gaps $g_1$ and $g_2$ (spacings between the mask 172 and the wafer 173 positions at the points 173$_1$ and 173$_2$) and the light spot spacings (corresponding to $2y_1$ and $2y_2$) on the sensor 177. This is illustrated in FIG. 12.

Namely, the diffraction grating (grating) 183 may be well set as being a diffraction-light producing diffraction grating having a convex lens function for converging light at the point F. This may correspond to a pattern 192-α (first pattern) and a pattern 192-β (second pattern) of FIG. 16, to be described later.

If the point to be defined by interconnecting the points 185$_1$ and 183$_2$ on the plane 175 and by interconnecting the points 185$_2$ and 183$_1$ is denoted by F', then the point F' has a coordinate ($p_f$, $q_f$) which can be expressed as follows:

$$p_f = [(|x_1|-|x_2|) \times b]/[|x_1|-|x_2|+y_1-y_2] \quad (3)$$

$$q_f = [(y_1-|x_2|)/b] \times \{[(|x_1|-|x_2|) \times b]/[|x_1|-|x_2|+y_1-y_2]\} - |x_2| \quad (4)$$

Namely, when the grating 183 is provided by a diffraction-light producing diffraction grating having a concave lens function with a focal point F' (this may correspond to a pattern 194-α (third pattern) and a pattern 194-β (fourth pattern) of FIG. 16), the relationship between the gap between the mask and the wafer and the light spot spacing on the sensor 177 surface has such a characteristic as depicted by a dash-and-dot line in FIG. 12. Consequently, where the grating 183 has a convex lens function with a focal point at F, the solid line in FIG. 12 is obtainable; where it has a concave lens function with a focal point at F', the dash-and-dot line in FIG. 12 is obtainable.

In this embodiment as described, the grating 183 comprises patterns (see FIG. 16) having convex lens function and concave lens function. In other words, it comprises first and second patterns 192-α and 192-β each having a convex lens function as well as third and fourth patterns 194-α and 194-β each having a concave lens function.

Thus this embodiment is so arranged that: first and second lights are projected inclinedly upon the second object 173 along different directions; the first light reflected by the surface of the second object is convergently deflected by the first pattern 192-α toward the detection plane 177 (see FIG. 9); the second light reflected by the surface of the second object is convergently deflected by the second pattern 192-β toward the detection plane 177; the spacing on the detection plane between the positions of incidence of the first and second lights incident on that plane is detected. It is also so arranged that third and fourth lights are projected inclinedly upon the second object 173 along different directions; the third light reflected by the surface of the second object is divergently deflected by the third pattern 194-α toward the detection plane 177; the fourth light reflected by the surface of the second object is divergently deflected by the fourth pattern 194-β toward the detection plane; the spacing upon the detection plane between the positions of incidence of the third and fourth lights incident on that plane is detected. It is further so arranged that the magnitude of that spacing, as the spacing along the detection plane between the positions of incidence of the third and fourth lights and the spacing along the detection plane between the positions of incidence of the first and second lights become equal to each other, is taken as a reference for the detection of the spacing between the first and second objects 172 and 173; and, by using at least one of (i) the spacing between the positions of incidence of the first and second lights and (ii) the spacing between the positions of incidence of the third and fourth lights, the spacing between the first and second objects 172 and 173 is determined.

A practical example will be explained with reference to FIG. 11.

If a=1000 microns, b=18700 microns, $|x_1|$=5 microns, $|x_2|$=29 microns and $|k|$=100 microns, then, from equations (1) and (2), it follows that:

$$y_1 = [(18700-1000)/1000] \times (100-5) + 100$$
$$= 1781.5 \text{ (microns)}$$
$$y_2 = [(18700-1000)/1000] \times (100-29) + 100$$
$$= 1356.7 \text{ (microns)}$$

Since the spacings $2y_1$ and $2y_2$ correspond to the light spot spacing (spacing 191 in FIG. 17) on the sensor 177 surface (FIG. 9), such a characteristic as depicted by the solid line in FIG. 13 is obtainable. Also, the following is provided:

$$p_f = [(5-29) \times 18700]/[5-29+1781.5-1356.7]$$
$$= 1119.760 \text{ (microns)}$$
$$q_f = [(1781.5-29)/18700] \times (-1119.76) - 29$$
$$= 75.940 \text{ (microns)}$$

Thus, where a concave lens function with a focal point at F'(−1119.760, 75.940) is given to the grating 183, such a characteristic as depicted by the dash-and-dot line in FIG. 13 is obtainable.

Here, the point of intersection between the solid line characteristic and the dash-and-dot line characteristic corresponds to the spacing (gap) of 70 microns. This will be explained by verification, below.

First, in FIG. 11, the coordinate of the point $Q_1$ of intersection between the plane 175 and a straight line connecting the point F' and the midpoint between $x_1$ and $x_2$, is to be detected. Since the point $Q_1$ is the point of intersection between P=18700 and a straight line that connects (−1119.76, 75.940) and (0, −17), the point $Q_1$ has a coordinate (18700, −1569.1).

On the other hand, the coordinate of the point $Q_2$ of intersection between the plane 175 and a straight line connecting the point F and the midpoint between $x_1$ and $x_2$, is then to be detected. Namely, since it is the point of intersection between p=18700 and a straight line that connects (1000, −100) and (0, −17), the point $Q_2$ has a coordinate (18700, −1569.1).

It is thus seen that: the point $Q_1$ coincides with the point $Q_2$; the light spot spacing on the sensor at this time is 1569.1×2=3136.2 (microns); and, in FIG. 13, as the gap is 70 microns, it is at the point Q of intersection between the solid line characteristic and the dash-and-dot line characteristic.

Thus, as illustrated in FIG. 11, a portion of the grating 183 on the mask 172 may be formed with patterns (first and second patterns 192-α and 192-β) having a convex lens function with a focal point at F. Also, in the neighborhood of these patterns, a portion of the grating 183 may be formed with grating patterns (third and fourth patterns 194-α and 194-β) having a concave lens function with a focal point at F' and a pattern corresponding to the grating pattern 178.

By setting the point Q of intersection of the characteristics of FIG. 13 so that it corresponds to the gap of 70 microns (the characteristics being obtainable by detecting the spacings (191 and 192) of four, i.e., two pairs of light spots (see FIG. 17) produced by these gratings), it is assured that, with the point of intersection of the characteristics of the light spot spacing on the sensor and the gap, the gap of an absolute value of 70 microns is specified.

It is an additional feature of this system that, even if the distance, e.g., between the lens 176 and the mask 172 or the spacing between the lens 176 and the sensor 177 changes slightly, the magnitude of the point Q of intersection in FIG. 13 is not substantially affected thereby and, therefore, with the point of intersection of the FIG. 13 characteristic, it is possible to determine precisely the spacing as 70 microns. This will be explained below by reference to the drawings.

If the spacing between the mask 172 and the lens 176 or the spacing between the lens 176 and the sensor 177 changes, the plane 175 shown in FIG. 11 becomes out of the conjugate relationship with the sensor 177 with respect to the lens 176. In other words, the position optically conjugate with the sensor 177 with respect to the lens 176 shifts to the plane 189, for example. Now, the light spot spacing upon the plane 189 of the diffraction light influenced by the mask 172 and the wafer 173, will be detected below.

If it shifts by a distance $\Delta b$ from the plane 175, then the point $S_1$ of intersection between the plane 189 and a straight line connecting the points $183_1$ and F can be expressed as follows:

$$S_1(18700+\Delta b, -1781.5-0.095\Delta b)$$

Also, the point $S_2$ of intersection between the plane 189 and a straight line connecting the points $183_2$ and F can be expressed as follows:

$$S_2(18700+\Delta b, -1356.7-0.071\Delta b)$$

Similarly, the point $S_1'$ of intersection between the plane 189 and a straight line connecting the points F' and $183_1$ can be expressed as follows:

$$S_1'(18700+\Delta b, -1356.7-0.0723\Delta b)$$

Further, the point $S_2'$ of intersection between the plane 189 and a straight line connecting the points F' and $183_2$ can be expressed as follow:

$$S_2'(18700+\Delta b, -1781.5-0.0937\Delta b)$$

Figure 14:
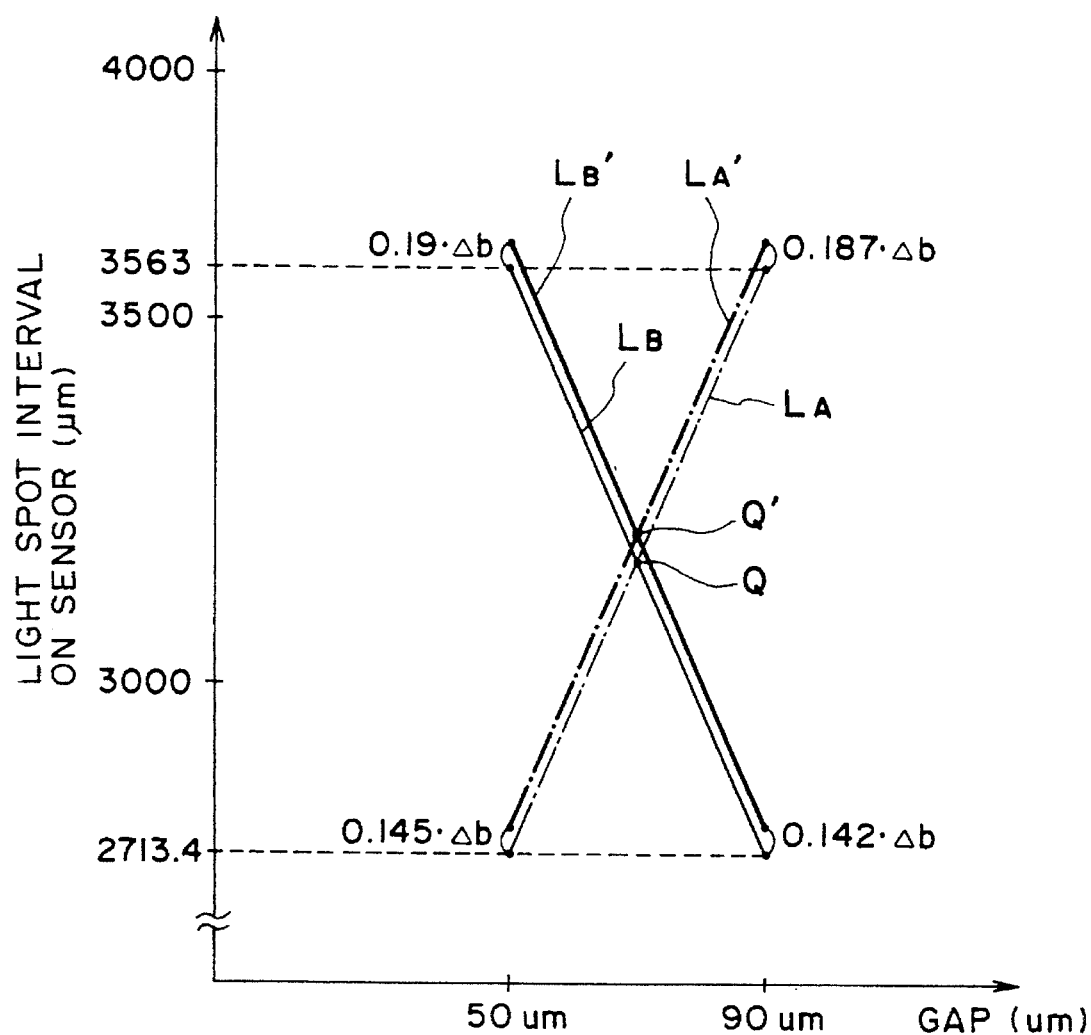
FIG. 14 is a graph for explaining the relationship between the spacing to be detected and the spacing between light spots on a sensor.

FIG. 14 shows the characteristic of light spot spacing on the sensor 177 versus the gap between the mask 172 and the wafer 173, which are obtainable from the preceding magnitudes.

In FIG. 14, straight lines $L_A$ and $L_B$ depict those characteristics just in accordance with the designed. Straight lines $L_A'$ and $L_B'$ depict those characteristics as the plane conjugate with the sensor 177 with respect to the lens 176 shifts to the plane 189.

In FIG. 14, the point Q is placed at the intersection between the characteristic lines $L_A$ and $L_B$, while the point Q' is placed at the intersection between the characteristic lines $L_A'$ and $L_B'$. The coordinate of the point Q can be expressed, as described hereinbefore, in the coordinate system of (gap, light spot spacing on the sensor) in FIG. 14, as follows:

$$Q(70, 3138.2)$$

Now, the coordinate of the point Q' will be detected below.

The straight line $L_A'$ is a line connecting a point (50, 2713.4+0.145$\Delta b$) and a point (90, 3563+0.187$\Delta b$). The straight line $L_B'$ is a line connecting a point (50, 3563+0.19$\Delta b$) and a point (90, 2713.4+0.142$\Delta b$). Thus, the point $Q_1'$ has a coordinate such as follows:

$$Q'(A,B)$$

wherein $$A=[(849.6+0.045\Delta b)/(1699.2+0.09\Delta b)]\times 40+50$$

$$B=[(849.6+0.042\Delta b)(849.6+0.045\Delta b)]/[1699.2+0.09\Delta b]+2713.4+0.145\Delta b$$

Thus, the point corresponding to the gap that can be expressed by $$[(849.6+0.045\Delta b)/(1699.2+0.09\Delta b)]\times 40+50 \text{ (unit: microns)},$$

is the point of intersection. This magnitude is equal to 70 microns, independently of the distance $\Delta b$, and thus the magnitude of the point Q or Q', namely, the magnitude of the point of intersection, can be determined as 70 microns.

FIG. 15 is a schematic view of a main portion of an embodiment of the present invention wherein a spacing measuring system of the invention is incorporated into a semiconductor device manufacturing exposure apparatus. Line numerals as those of FIG. 9 are assigned to corresponding elements.

Denoted in FIG. 15 at 101 is a light source which may comprise a laser diode, LED or Hg lamp, for example. The light source 101 produces waves such as electro-magnetic wave or acoustic waves, for example. Hereinafter, the waves from the light source will be referred to simply as "light". The light from the light source 101 is transformed by a collimator lens into a parallel light which in turn is collected by a light projecting lens 103. Then, the light is reflected by a mirror 104 and, after passing through a protection window 105, it is projected inclinedly on grating lenses 178 and 183 as plane waves. The grating lenses are provided in a scribe line region on a first object (e.g. mask) 172, and each of them may comprise a kind of Fresnel zone plate. The grating lenses 178 and 183 are formed adjacent to four corners, respectively, of the mask 172.

In the present embodiment it is not always necessary to use plane waves as the light to be projected to the grating lenses 178 and 183. However, for convenience in explanation, the following description will be made on a design example wherein plane waves are inputted. As plane waves are incident on the grating lenses 178 and 183, the input light is diffracted thereby and then is reflected by the surface of the wafer. By this, light spots are formed on a sensor 177. The spacing between these light spots provides the information about the spacing between the mask and the wafer, as described hereinbefore.

FIG. 16 shows an embodiment of patterns of grating lenses 178 and 183 of the mask 172, where the spacing measurement is to be executed.

In FIG. 16, patterns 191-α and 191-β (193-α and 193-β) correspond to the patterns of the grating lens 178 of FIG. 11. First and second patterns 192-α and 192-β (third and fourth patterns 194-α and 194-β) correspond to the patterns of the grating lens 183 of FIG. 11. The light incident on the area of the pattern 191-α is diffracted and then is reflected by the wafer 173, and it is again diffracted by the first pattern 192-α. After this, it goes through the lens 176 and is received by the sensor $177_1$ (first detecting means).

Figure 17:
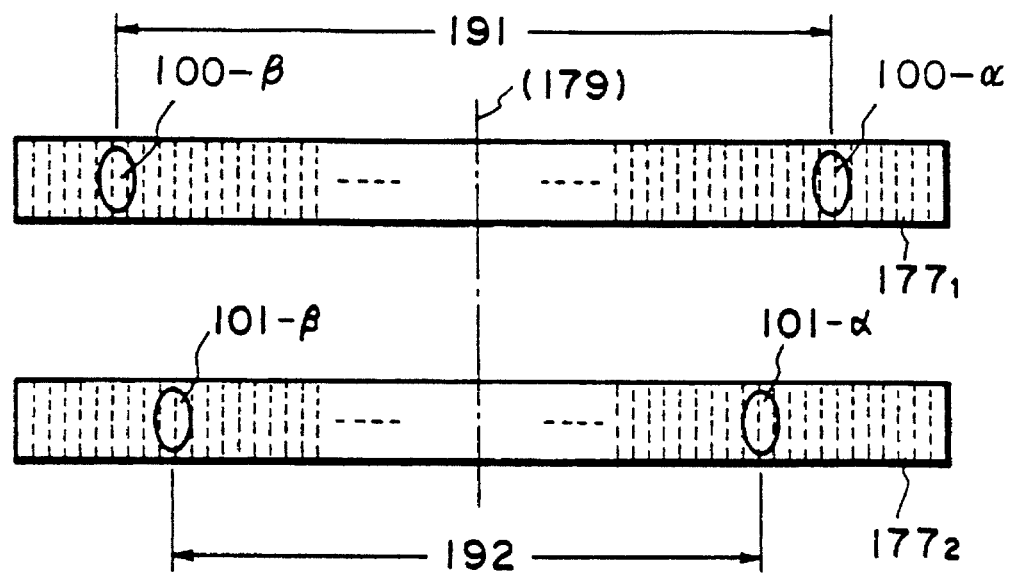
FIG. 17 is a schematic view, showing light spots on the surface of a sensor of FIG. 15.

Namely, the pattern 191-α and the first pattern 192-α cooperate in a pair to produce a light spot 100-α on the sensor $177_1$ (FIG. 17). The light spot formed by the patterns 191-α and 192-α corresponds to the light spot 100-α on the sensor $177_1$ shown in FIG. 17. The light spot formed by the patterns 191-β and 192-β corresponds to the light spot 100-β on the sensor $177_1$. The first and second patterns 192-α and 192-β are symmetric with each other with respect to the optical axis 179.

The first and second patterns 192-α and 192-β each has a convex lens function and serves to converge the diffraction light toward the point F in FIG. 11. Similarly, the third and fourth patterns 194-α and 194-β each has a concave lens function and serves to apply to the diffraction light a lens action having its focal point at F' in FIG. 11.

Thus, the light spot formed by the patterns 193-α and 194-α corresponds to the light spot 101-α on the line sensor $177_2$ (second detecting means) of FIG. 17. The light spot formed by the patterns 193-β and 194-β corresponds to the light spot 101-β of FIG. 17.

The characteristic which can be provided by the spacing between the light spots 100-α and 100-β according to the gap between the mask and the wafer, defines the straight line $L_B$ in FIG. 14, while the characteristic which can be provided by the spacing between the light spots 101-α and 101-β according to the gap between the mask and the wafer defines the straight line $L_A$ of FIG. 14.

The embodiment of patterns of FIG. 16 is based on an example wherein, in FIG. 13, a=1 mm, b=19 mm and k=100 microns.

This embodiment may be so modified that: pairs of the first and second patterns are formed at different locations on the first object; a pair of the third and forth patterns are formed at at least one location on the first object; the magnitude of spacing which is to be used as a reference for the detection of the spacing between the first and second objects, is determined by using the pair of third and fourth patterns formed at the aforementioned one location as well as that pair of first and second patterns corresponding to the third and fourth patterns; and, by using another pair of first and second patterns which are different from the pair of first and second patterns corresponding to the apir of third and fourth patterns formed at the aforementioned one location, the spacing between the first and second objects, at a position different from the aforementioned one location, is detected.

Further, the embodiment may be so modified that: pairs of the third and fourth patterns are formed at different locations on the first object; a pair of the first and second patterns are formed at at least one location on the first object; the magnitude of spacing which is to be used as a reference for the detection of the spacing between the first and second objects is determined by using the pair of first and second patterns formed at the aforementioned one location as well as that pair of the third and fourth patterns corresponding to the first and second patterns; and, by using another pair of third and fourth patterns which are different from the pair of third and fourth patterns corresponding to the pair of first and second patterns formed at the aforementioned one location, the spacing between the first and second objects, at a position different from the aforementioned one location, is detected.

Alternatively, pairs of the first and second patterns and pairs of the third and fourth patterns may be provided at different locations on the first object, such that, by using each pair of first and second patterns and each pair of third and fourth patterns at each location, the spacing between the first and second objects at each location may be detected.

Further, a pair of the first and second patterns and a pair of the third and fourth patterns may be disposed symmetrically with respect to a certain axis.

Figure 18:
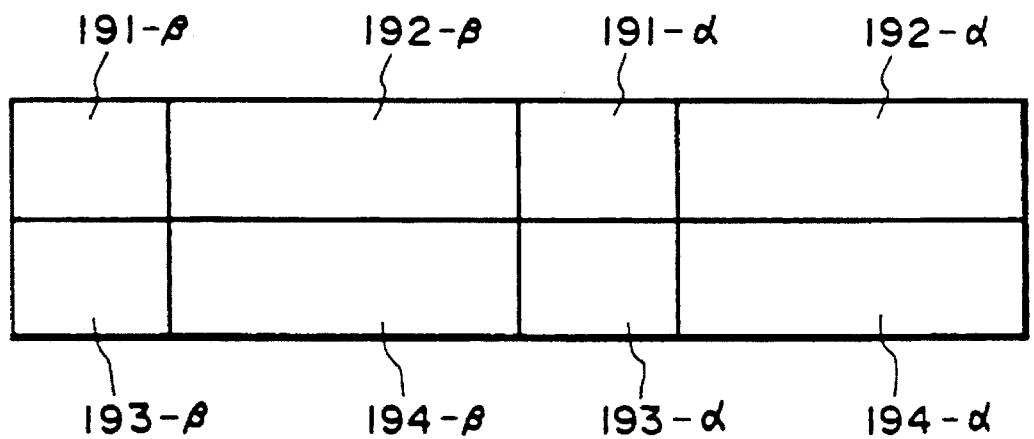
FIG. 18 is a schematic view of modified forms of physical optic elements provided on a mask.

The pattern arrangement on the mask 172 may be modified in various ways and, as an example, the patterns corresponding to the area of FIG. 16 may be modified such as shown in FIG. 18.

In FIG. 18, details of patterns 191-α, 192-α, 191-β, 192-β, 193-α, 193-β, 194-α and 194-β, are essentially the same as those shown in FIG. 16. Also, the manner of light incidence, diffraction, reflection and second diffraction will be similar as that in FIG. 16.

In the present embodiment, after the step of detecting the surface spacing between the mask and the wafer as described, a circuit pattern of the mask is transferred to the wafer. Thereafter, through a known developing process, etc., semiconductor chips are produced.

In accordance with this embodiment of the present invention, as described hereinbefore, patterns are so set that the detection signal characteristics based on the relationship between the surface spacing (gap) between a mask and a wafer and a signal obtainable from a sensor have an intersection such as depicted in FIG. 14 and, by using such point of intersection, an absolute value of the gap is determined precisely.

While in the foregoing the invention has been described with reference to some embodiments of X-ray exposure apparatus of proximity type, the invention is applicable also to the spacing detection with regard to the focus position in an exposure apparatus such as a stepper wherein an image of a reticle is projected and printed on a wafer by using a projection (imaging) lens system.

Figure 19:
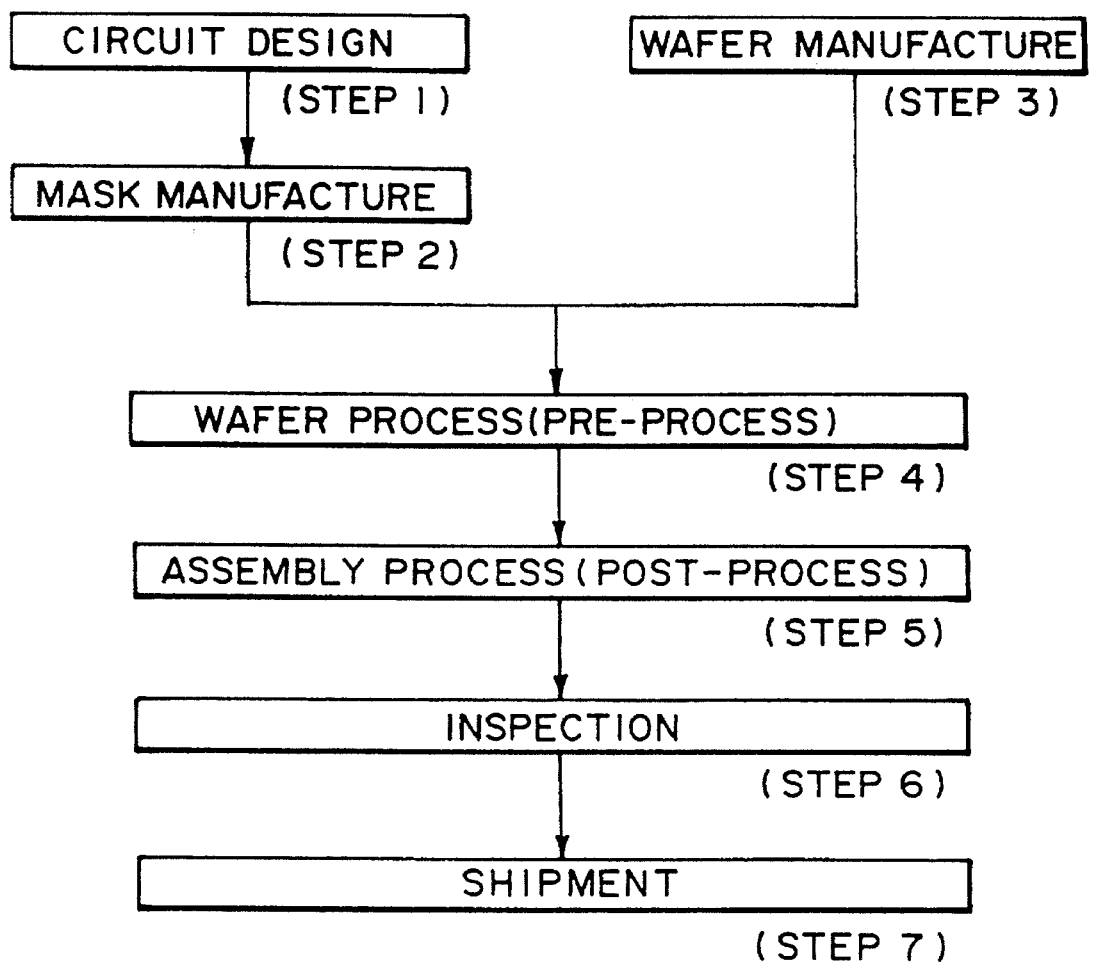
FIG. 19 is a flow chart of semiconductor device manufacturing processes.

FIG. 19 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 20:
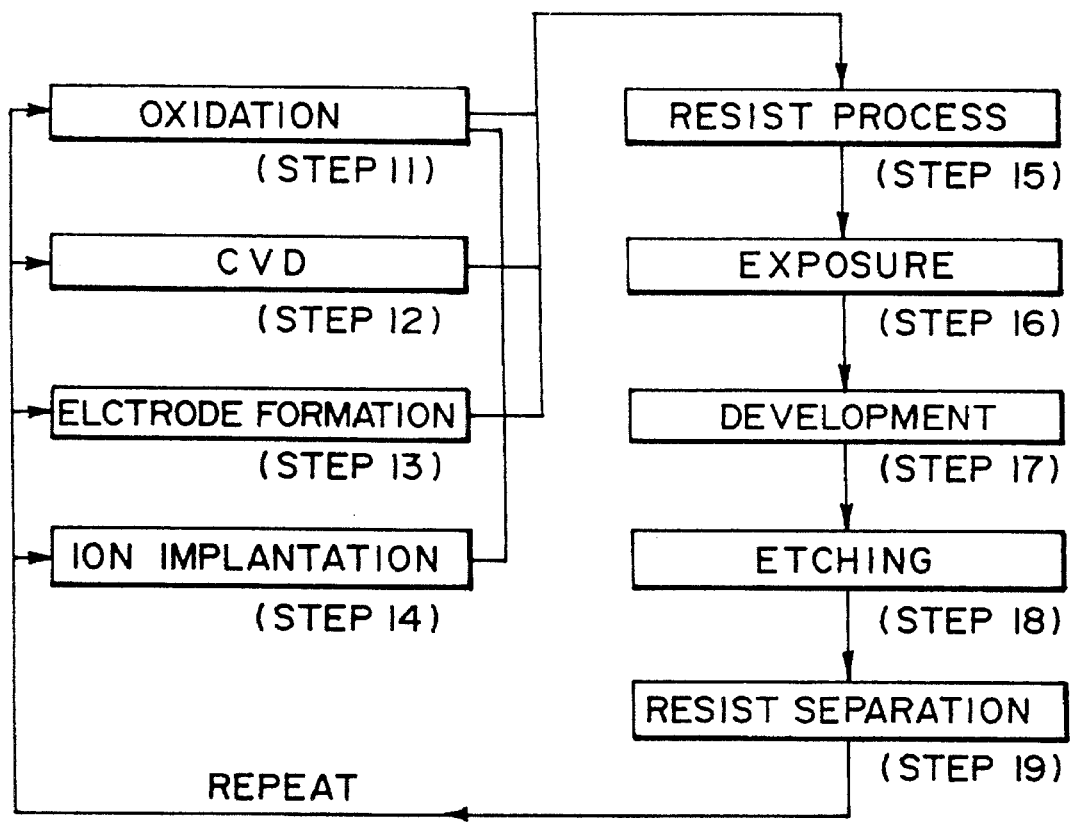
FIG. 20 is a flow chart showing details of a wafer process.
Figure 21:
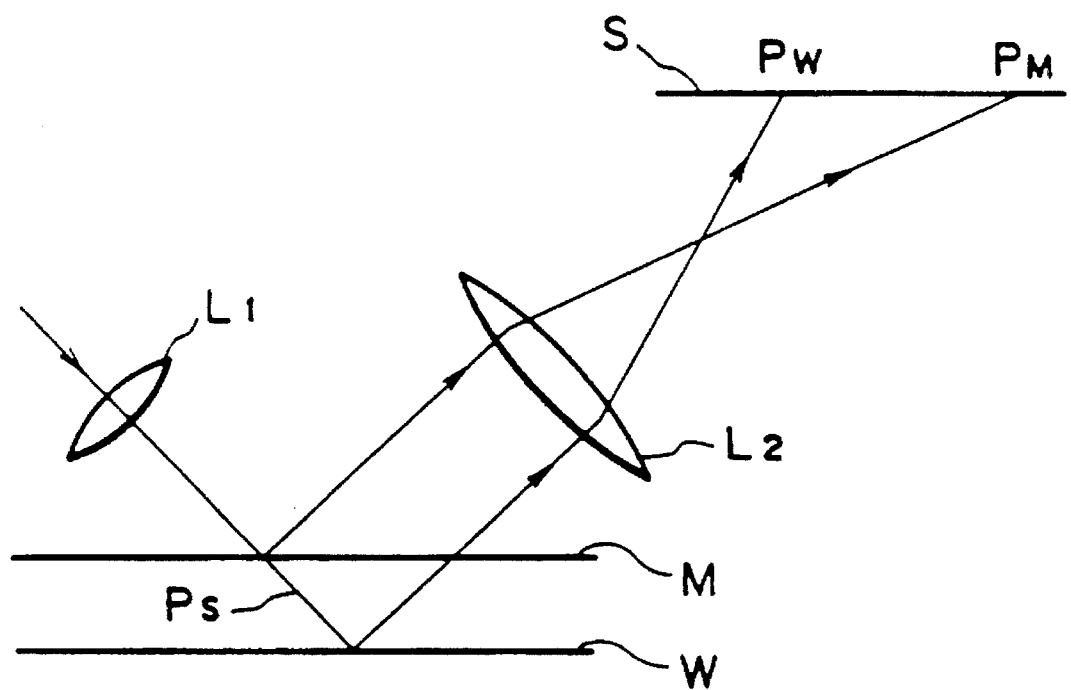
FIG. 21 is a schematic view of a main portion of a spacing measuring system of known type.

FIG. 20 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting a positional relationship between a first object and a second object, said method comprising steps of:
   projecting a first light through a convex lens mark of the first object and a concave lens pattern of the second object onto a first plane;
   projecting a second light through a concave lens mark of the first object and a convex lens pattern of the second object onto the first plane;
   wherein a first spacing between positions of incidence of the first light and the second light on the first plane increases with displacement of the second object relative to the first object in a predetermined direction;
   projecting a third light through a concave lens mark of the first object and a convex lens pattern of the second object onto a second plane;
   projecting a fourth light through a convex lens mark of the first object and a concave lens pattern of the second object onto the second plane;
   wherein a second spacing between positions of incidence of the third light and the fourth light on the second plane decreases with displacement of the second object relative to the first object in the predetermined direction; and
   determining a reference for the detection of a position of the first object relative to a position of the second object on the basis of the first spacing between positions of incidence of the first light and the second light on the first plane and the second spacing between positions of incidence of the third light and the fourth light on the second plane, corresponding to the first spacing and the second spacing being substantially equal to each other.

2. A method according to claim 1, wherein the first object is a mask and the second object is a wafer.

3. A method according to claim 1, wherein each of the mark and the pattern comprises a zone plate.

4. A method of detecting a gap between a first object and a second object, said method comprising steps of:
   projecting a first light at an angle and in a first direction onto the second object such that the first light is reflected by the second object;
   deflecting by a convex lens pattern of the first object the reflected first light and projecting the deflected first light onto a first detection plane;
   projecting a second light at an angle and in a second direction different from the first direction onto the second object such that the second light is reflected by the second object;
   deflecting by a convex lens pattern of the first object the reflected second light and projecting the deflected second light onto the first detection plane;
   wherein a first spacing between positions of incidence of the deflected first light and the deflected second light on the first detection plane increase with displacement of the second object relative to the first object in a predetermined direction;
   projecting a third light at an angle and in a third direction onto the second object such that the third light is reflected by the second object;
   deflecting by a concave lens pattern of the first object the reflected third light and projecting the defelcted third light onto a second detection plane;
   projecting a fourth light at an angle and in a fourth direction different from the third direction onto the second object such that the fourth light is reflected by the second object;
   deflecting by a concave lens pattern of the first object the reflected fourth light and projecting the deflected fourth light onto the second detection plane;
   wherein a second spacing between positions of incidence of the deflected third light and the deflected fourth light on the second detection plane decreases with displacement of the second object relative to the first object in the predetermined direction; and
   determining a reference for the detection of a gap between the first object and the second object on the basis of the first spacing between positions of incidence of the deflected first light and the deflected second light on the first detection plane and the second spacing between positions of incidence of the deflected third light and the deflected fourth light on the second detection plane, corresponding to the first spacing and the second spacing being substantially equal to each other.

5. A method according to claim 4, wherein the first object is a mask and the second object is a wafer.

6. A method according to claim 4, wherein each of the patterns comprises a zone plate.

* * * * *

UNITED STATES PATENT AND TRADEMARK OFFICE
CERTIFICATE OF CORRECTION

PATENT NO. : 5,495,336
DATED : February 27, 1996
INVENTOR(S) : Noriyuki NOSE, et al.

It is certified that error appears in the above-indentified patent and that said Letters Patent is hereby corrected as shown below:

On the title page,

Under "FOREIGN PATENT DOCUMENTS", item [56]:

"560157033   12/1991   Japan ." should read
--56-157033   12/1991   Japan .--.

IN THE DISCLOSURE:

COLUMN 1:

Line 22, "Conventionally" should read --Conventionally,--.

COLUMN 6:

Line 53, "displaces" should read --displaced--.

UNITED STATES PATENT AND TRADEMARK OFFICE
CERTIFICATE OF CORRECTION

PATENT NO. : 5,495,336   Page 2 of 3
DATED : February 27, 1996
INVENTOR(S) : Noriyuki NOSE, et al.

It is certified that error appears in the above-indentified patent and that said Letters Patent is hereby corrected as shown below:

COLUMN 7:

Line 28, "that: where" should read --that when--.

COLUMN 9:

Line 29, "PGDs," should read --PSDs,--.

COLUMN 11:

Line 66, "that:" should read --that--.

COLUMN 13:

Line 62, "follow:" should read --follows:--.

UNITED STATES PATENT AND TRADEMARK OFFICE
CERTIFICATE OF CORRECTION

PATENT NO. : 5,495,336  Page 3 of 3
DATED : February 27, 1996
INVENTOR(S) : Noriyuki NOSE, et al.

It is certified that error appears in the above-indentified patent and that said Letters Patent is hereby corrected as shown below:

COLUMN 15:

Line 47, "that:" should read --that--; and
Line 63, "that:" should read --that--.

COLUMN 18:

Line 23, "increase" should read --increases--; and

Line 30, "defelcted" should read --deflected--.

Signed and Sealed this

Thirteenth Day of August, 1996

Attest:

BRUCE LEHMAN

Attesting Officer   Commissioner of Patents and Trademarks